United States Patent
Fujimura et al.

(10) Patent No.: US 10,971,914 B2
(45) Date of Patent: Apr. 6, 2021

(54) CIRCUIT ASSEMBLY

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Yuki Fujimura, Mie (JP); Ryoya Okamoto, Mie (JP); Hiroshi Shimizu, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD. <, Osaka (JP)

( * ) Notice: Subject to any disclaimer, the term of this patent is extended or adjusted under 35 U.S.C. 154(b) by 0 days.

(21) Appl. No.: 16/351,041

(22) Filed: Mar. 12, 2019

(65) Prior Publication Data
US 2019/0297720 A1 Sep. 26, 2019

(30) Foreign Application Priority Data
Mar. 23, 2018 (JP) .............................. JP2018-055952

(51) Int. Cl.
*H02G 5/10* (2006.01)
*H05K 7/20* (2006.01)

(52) U.S. Cl.
CPC .............. *H02G 5/10* (2013.01); *H05K 7/209* (2013.01); *H05K 7/20854* (2013.01); *H05K 2201/10272* (2013.01); *H05K 2201/10409* (2013.01)

(58) Field of Classification Search
CPC ........... H05K 1/00–0212; H05K 1/181; H05K 7/205; H05K 3/303; H05K 2201/10272;
(Continued)

(56) References Cited

U.S. PATENT DOCUMENTS 7,518,882 B2 * 4/2009 Shimizu ............... H05K 1/0263
174/262
8,094,461 B2 * 1/2012 Tagano .................. H01R 12/58
361/772
(Continued)

FOREIGN PATENT DOCUMENTS

JP 2002-176279 6/2002

*Primary Examiner* — Zachary Pape
*Assistant Examiner* — Amir A Jalali
(74) *Attorney, Agent, or Firm* — Greenblum & Bernstein, P.L.C.

(57) ABSTRACT

The heat dissipation of a circuit assembly is improved. A circuit assembly includes: a relay that includes a terminal and generates heat when energized/as a result of energization/due to being energized; a base member to which the relay is attached and in which a through hole is formed; a heat dissipation member that is provided on a side of the base member opposite to a side on which the relay is attached; a first busbar that is connected to the terminal of the relay at a position spaced apart from the base member; and a heat transfer member that is inserted into the through hole so as to be movable in a direction along the axial direction of the through hole, and that comes into contact with the first busbar and the heat dissipation member.

9 Claims, 25 Drawing Sheets

(58) Field of Classification Search
CPC .......... H05K 2201/10409; H05K 2201/10416; H01L 23/34–4735
USPC .......... 361/704, 719–722; 174/252; 257/713, 257/720
See application file for complete search history.

(56) References Cited

U.S. PATENT DOCUMENTS

| | | | | |
|---|---|---|---|---|
| 8,254,133 | B2* | 8/2012 | Imai | H01L 23/04 361/720 |
| 2003/0137813 | A1* | 7/2003 | Onizuka | H05K 1/0263 361/777 |
| 2006/0039127 | A1* | 2/2006 | West | H02M 7/003 361/803 |
| 2006/0126316 | A1* | 6/2006 | Takagi | H05K 3/202 361/775 |
| 2009/0321900 | A1* | 12/2009 | Yoshida | H01L 23/3107 257/666 |
| 2011/0024896 | A1* | 2/2011 | Tsunoda | H01L 24/32 257/707 |
| 2013/0235636 | A1* | 9/2013 | Kadoguchi | H01L 23/49575 363/131 |
| 2014/0078679 | A1* | 3/2014 | Tsunoda | G06F 1/203 361/720 |
| 2014/0360749 | A1* | 12/2014 | Gao | H01R 4/4809 174/68.2 |
| 2015/0061098 | A1* | 3/2015 | Imoto | H01L 24/33 257/676 |
| 2017/0202088 | A1* | 7/2017 | Nakamura | H05K 1/111 |
| 2017/0208688 | A1* | 7/2017 | Nakamura | H05K 1/0209 |
| 2017/0238411 | A1* | 8/2017 | Kobayashi | B32B 7/12 361/705 |
| 2018/0343737 | A1* | 11/2018 | Morimoto | H01L 25/07 |
| 2018/0370463 | A1* | 12/2018 | Haraguchi | H02G 3/16 |
| 2019/0208617 | A1* | 7/2019 | Kita | H05K 1/181 |

* cited by examiner

[FIG. 3]

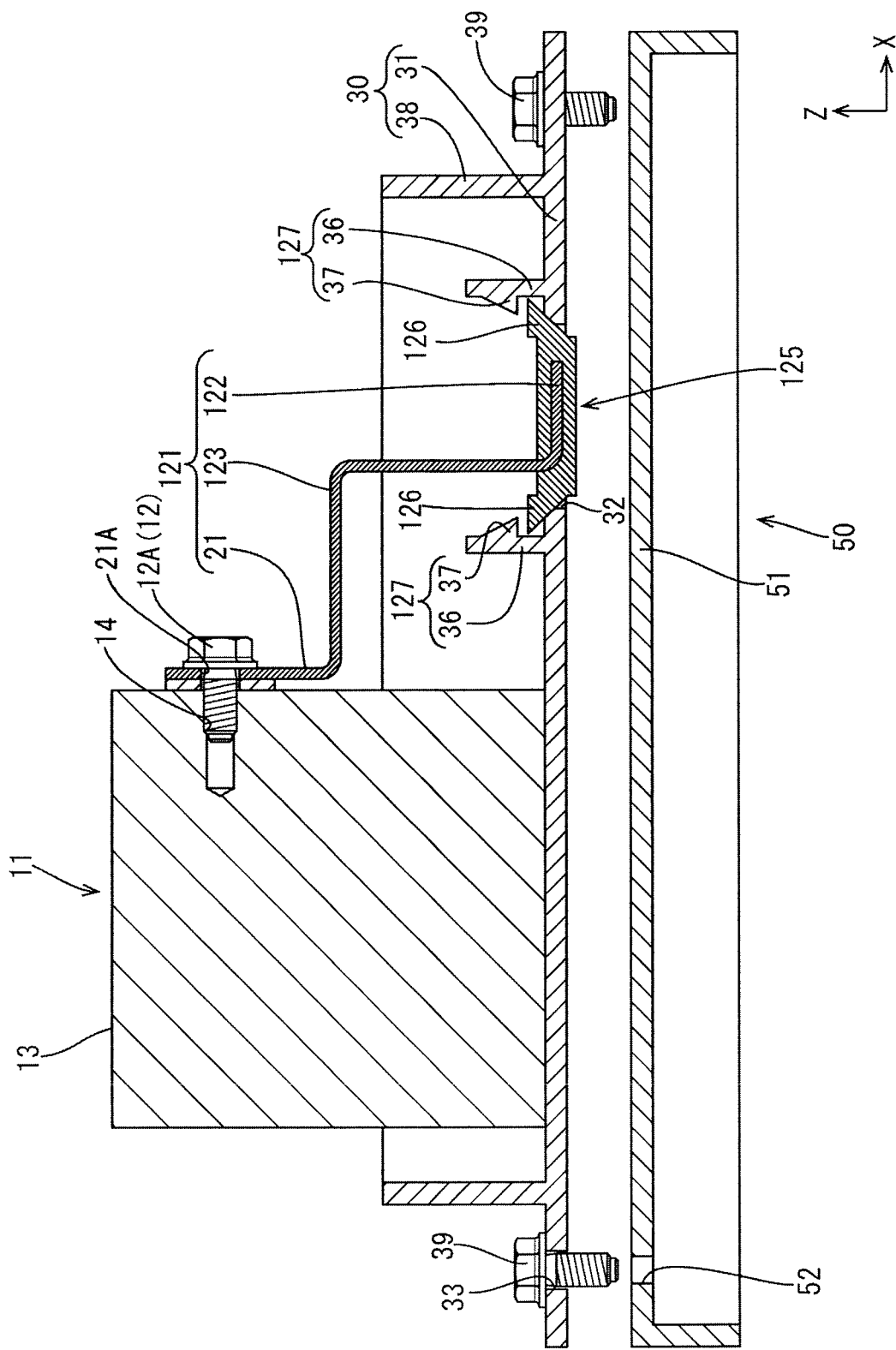

CIRCUIT ASSEMBLY

TECHNICAL FIELD

A technique for dissipating heat of an electronic component is disclosed herein.

BACKGROUND ART

Conventionally, techniques for dissipating the heat of an electronic component mounted to a substrate are known. The electronic unit disclosed in JP 2002-176279A includes a power circuit body to which a relay is attached, and the power circuit body includes a heat dissipation plate formed by an aluminum alloy plate, a busbar that is provided on the heat dissipation plate and to which a relay terminal is soldered, and an insulating heat conduction sheet that is interposed between the heat dissipation plate and the busbar and integrates the heat dissipation plate and the busbar into one piece. The heat dissipation plate includes a pair of side wall portions that are bent at substantially right angles, and the pair of side wall portions are fixed to a case. The heat generated by the relay is transferred from the relay terminal to the busbar, and is dissipated to the outside via the heat conduction sheet and the heat dissipation plate.

JP 2002-176279A is an example of related art.

SUMMARY OF THE INVENTION

In the above-described configuration, the busbar of the power circuit body is integrated with the heat dissipation member as one piece with the heat conduction sheet interposed therebetween. Accordingly, there are constraints on modifications that can be made to the busbar, resulting in a problem in that it is difficult to improve heat dissipation by changing the path of the busbar.

The technique disclosed herein has been completed based on the above-described circumstances, and an object thereof is to improve the heat dissipation of a circuit assembly.

A circuit assembly as described herein includes: a heat generation component that includes a terminal and generates heat when energized/as a result of energization/due to being energized; a base member to which the heat generation component is attached and in which a through hole is formed; a heat dissipation member that is provided on a side of the base member opposite to a side on which the heat generation component is attached; a busbar that is connected to the terminal of the heat generation component at a position spaced apart from the base member; and a heat transfer member that is inserted into the through hole so as to be movable in a direction along an axial direction of the through hole, and that comes into contact with the busbar and the heat dissipation member.

With this configuration, the heat of the heat generation component can be dissipated to the outside from the heat dissipation member via the busbar and the heat transfer member. By using the busbar that is connected to the terminal of the heat generation component at a position spaced apart from the base member for dissipating heat from the heat generation component, the shape of the busbar can be easily modified, thus making it possible to easily improve heat dissipation by increasing the contact area between the busbar and the heat transfer member. Here, when the heat transfer member that comes into contact with the busbar and the heat dissipation member is fixed to the base member, there is concern that due to a dimensional accuracy error between the bus bar, the heat transfer member, the base member and the like, the busbar and the heat transfer member, or the heat transfer member and the heat dissipation member may not sufficiently come into close contact with each other, or may come into contact with each other with excessive pressure, resulting in reduced thermal conductivity and hence reduced heat dissipation. With the above-described configuration, the heat transfer member is inserted into the through hole of the base member so as to be movable in a direction along the axial direction of the through hole. Therefore, even when there is a dimensional accuracy error between the bus bar, the heat transfer member, the base member, and the like, the dimensional accuracy error can be absorbed by the heat transfer member moving in the through hole in the direction along the axial direction of the through hole. Accordingly, a reduction in the thermal conductivity in a path extending from the busbar to the heat dissipation member via the heat transfer member can be suppressed, thus making it possible to improve heat dissipation.

The following embodiments are preferable as embodiments of the technique described herein.

The busbar is elastically deformed by being pressed by the heat transfer member.

With this configuration, the heat transfer member can be easily brought into close contact with the busbar through elastic deformation of the busbar, thus making it possible to improve the thermal conductivity between the busbar and the heat transfer member.

A fastening portion configured to restrict movement of the heat transfer member that exceeds a predetermined amount is fixed to the base member.

With this configuration, it is possible to inhibit excessive deformation of the busbar caused by an increased amount of movement of the heat transfer member relative to the base member.

A surface of the busbar is in surface contact with a surface of the heat transfer member.

With this configuration, the contact area between the busbar and the heat transfer member can be increased, thus making it possible to improve heat dissipation.

The busbar is embedded in the heat transfer member.

With this configuration, it is possible to improve the thermal conductivity due to close contact between the heat transfer member and the busbar, while inhibiting positional displacement between the busbar and the heat transfer member.

The busbar is a heat dissipating busbar configured not to be energized when the heat generation component is in operation.

With this configuration, by using the heat dissipating busbar that is not energized when the heat generation component is in operation, it is possible to modify the shape of the busbar regardless of the energization path.

The heat transfer member includes a body that is passed through the through hole, and a bulging portion that extends in a radial direction of the body and that is not inserted into the through hole, and the bulging portion is disposed between the busbar and the base member.

With this configuration, the contact area between the busbar and the heat transfer member can be increased by the bulging portion of the heat transfer member, thus making it possible to improve heat dissipation. Additionally, the interval between the busbar and the base member can be maintained by the bulging portion.

According to the technique disclosed herein, it is possible to improve the heat dissipation of a circuit assembly.

BRIEF DESCRIPTION OF THE DRAWINGS

FIG. 25 is a diagram illustrating an assembling process of the circuit assembly.

EMBODIMENTS OF THE INVENTION

Embodiment 1

Embodiment 1 will be described with reference to FIGS. 1 to 5.

A circuit assembly 10 according to the present embodiment can be mounted on, for example, a vehicle such as an electric car or a hybrid car, and enables the supply and control of power from a power supply such as a battery to a load such as a motor. Although the circuit assembly 10 may be disposed in any orientation, the following description assumes that the X direction in FIG. 1 is forward, the Y direction is left, and the Z direction is upward.

Figure 1:
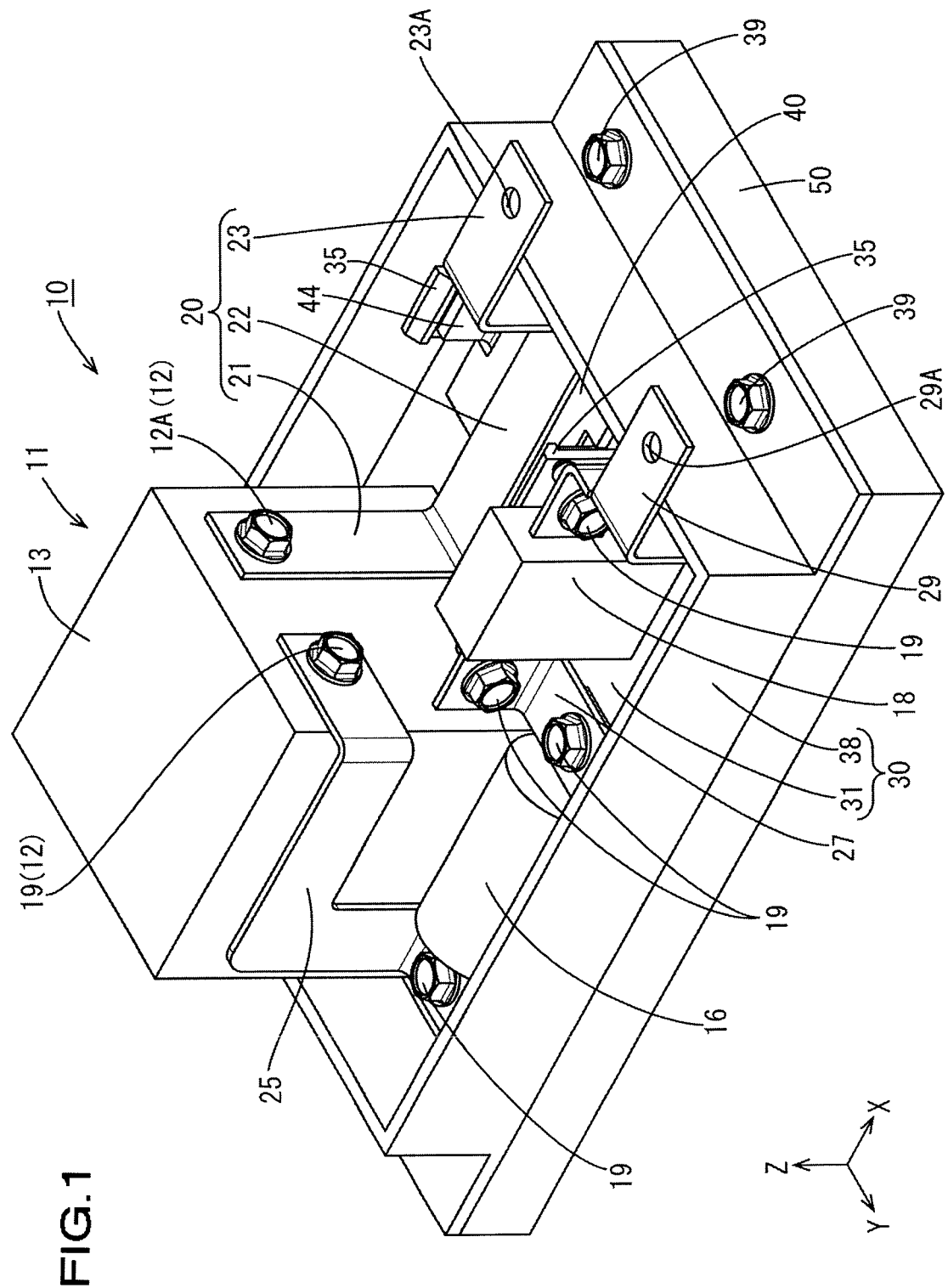
FIG. 1 is a perspective view showing a circuit assembly according to Embodiment 1.
Figure 2:
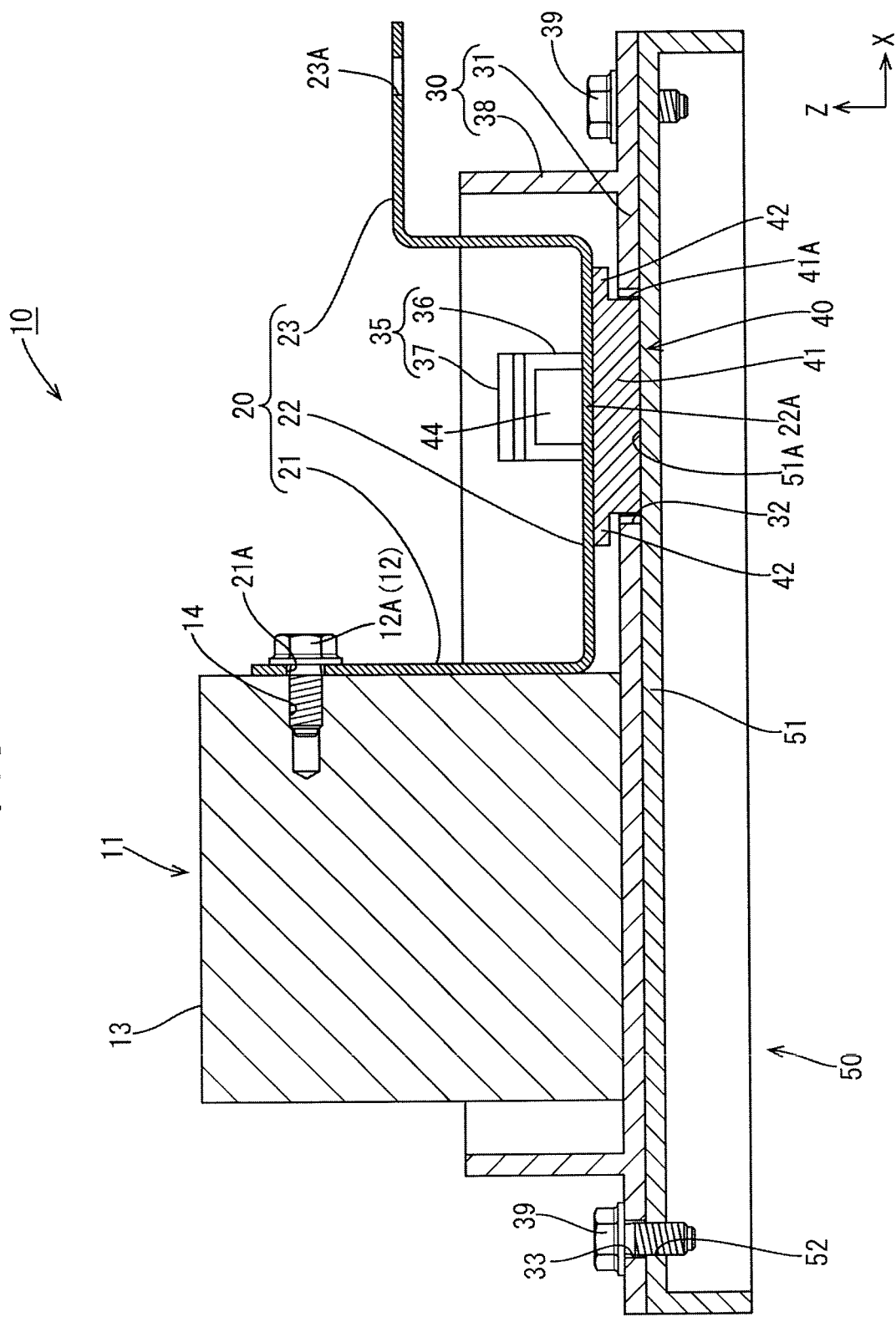
FIG. 2 is a vertical cross-sectional view showing the circuit assembly.

As shown in FIGS. 1 and 2, the circuit assembly 10 includes a relay 11 (an example of a "heat generation component") including a plurality of terminals 12, a plurality of busbars 20 and 25 that are connected to the terminals 12 of the relay 11, a base member 30 to which the relay 11 is attached, and a heat dissipation member 50 provided under the base member 30.

The relay 11 is a mechanical relay formed by a box-shaped resin case 13, and a contact portion and a coil portion, which are not shown, are included inside the case 13. A pair of screw holes 14 to which screws 12A and 19 serving as the terminals 12 can be screwed are formed in the front surface (one side surface) of the relay 11. Note that, although a mechanical relay is used as the heat generation component in the present embodiment, the heat generation component is not limited thereto. For example, a coil, a resistor, a capacitor or the like may be used as the heat generation component.

The plurality of busbars 20 and 25 are each formed by a plate made of a metal such as copper, a copper alloy, aluminum, or an aluminum alloy that has high thermal conductivity and low electrical resistance, and include a first busbar 20 that extends to the forward side and is connected to an external terminal (not shown), and a second busbar 25 that is connected to another electronic component 16. The busbars 20 and 25 are both formed by being bent to predetermined width dimensions a plurality of times, and are connected to the terminals 12 of the relay 11 at positions spaced apart from the base member 30.

The first busbar 20 includes a terminal connection portion 21 that is connected to one terminal 12 and extends downward, an external connection portion 23 that is connected to the external terminal, and the opposing portion 22 that is disposed between the terminal connection portion 21 and the external connection portion 23 and is opposed to the upper surface of the base member 30. A screw hole 21A through which the shaft portion of the screw 12A is passed is formed extending through the upper end portion of the terminal connection portion 21. The external connection portion 23 extends in a crank shape on the forward side relative to the opposing portion 22, and a screw hole 23A is formed in the distal end portion of the external connection portion 23. The opposing portion 22 extends along the upper surface of the base member 30, and the external connection portion 23 side thereof serves as a heat transfer contact portion 22A that comes into contact with a heat transfer member 40, which will be described below. A gap having predetermined dimensions is formed between the lower surface of the opposing portion 22 and the upper surface of the base member 30.

As shown in FIG. 1, the second busbar 25 is connected to the electronic component 16 along a side surface of the relay 11, and is electrically connected to an external connection terminal portion 29 that can be connected to an external terminal via the electronic component 16 and the like. Although the electronic component 16 is formed as a fuse in the present embodiment, the electronic component 16 is not limited thereto, and may be formed as, for example, a resistor, a coil or the like. One terminal portion of the electronic component 16 is connected to the second busbar 25 by being fastened with a screw 19, and the other terminal portion is connected to one terminal portion of a relay busbar 27 by being fastened with a screw 19. The other terminal portion of the relay busbar 27 is connected via another component 18 to the external connection terminal portion 29 in which a screw hole 29A is formed.

The base member 30 is made of an insulating synthetic resin, and includes a plate-shaped portion 31 having a flat plate shape, and a partition wall 38 standing upright from the plate-shaped portion 31. As shown in FIG. 2, a through hole 32 through which the heat transfer member 40 is passed, and screw holes 33 through which the shaft portions of screws 39 are passed are formed extending through the plate-shaped portion 31.

The through hole 32 is formed in a rectangular shape. Note that the shape of the through hole 32 can be modified into any shape according to the shape of the heat transfer member 40, and may be a circular shape, an oblong shape, or a polygonal shape, for example. The screw holes 33 are provided in portions located on the front and rear end sides of the plate-shaped portion 31, and on the outer side of the partition wall 38.

Fastening portions 35 that restrict movement of the heat transfer member 40 that exceeds a predetermined amount by locking to the heat transfer member 40 stand upright at edge portions of the through hole 32 (the vicinity of the through hole 32) of the plate-shaped portion 31. Each fastening portion 35 includes an upright piece 36 extending upward in a band shape, and a claw-shaped locking portion 37 provided at the distal end portion of the upright piece 36. The locking portion 37 protrudes in a step shape from the upper end portion of the upright piece 36 toward the through hole 32 side, and its protruding dimension decreases in a slope shape toward the upper end side (the distal end).

Figure 3:
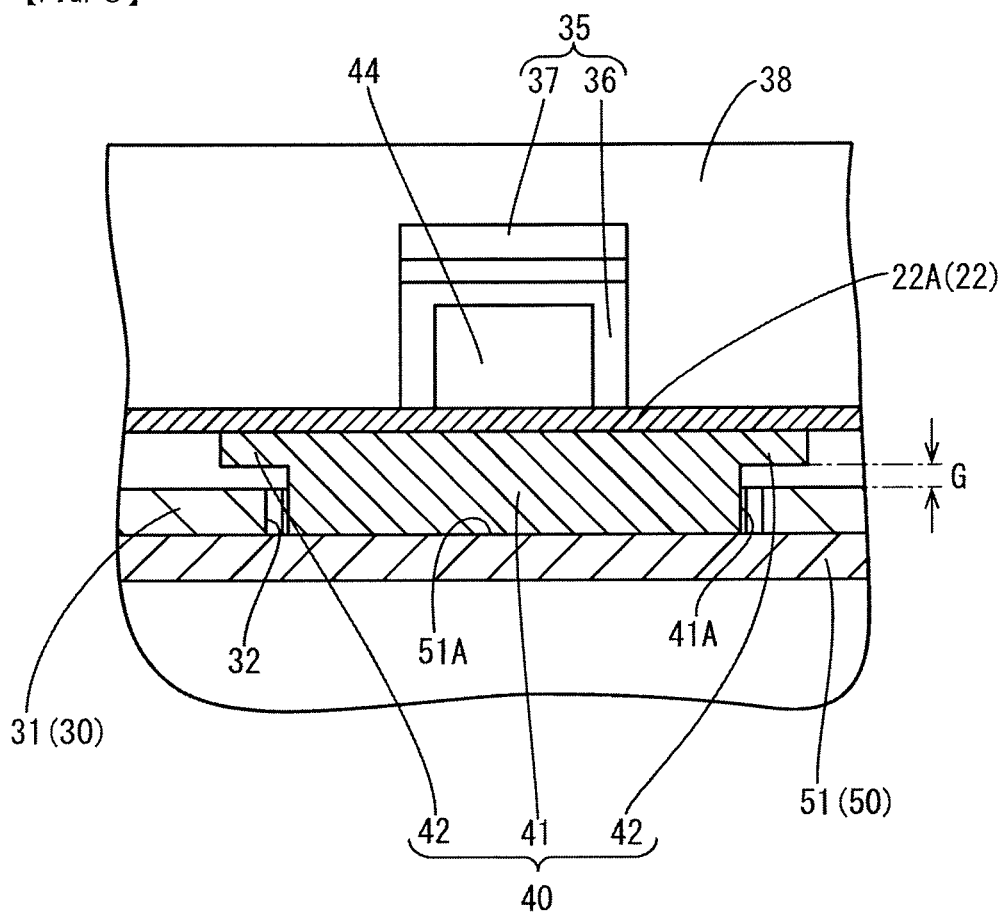
FIG. 3 is an enlarged view of the vicinity of a heat transfer member.

The heat transfer member 40 includes a body 41 that is inserted into the through hole 32, a bulging portion 42 that bulges from the upper end portion of the body 41 in the radial direction, and locked portions 44 (see FIG. 10) protruding upward from the left and right end portions of the upper end portion of the body 41. Each locked portion 44 includes a band-shaped portion 45 extending upward in a band shape, and a protrusion 46 protruding outward from the upper end portion of the band-shaped portion 45. The body 41 is formed to have a rectangular cross-sectional shape in plan view that corresponds to the shape of the through hole 32, and a small gap is formed between an outer peripheral surface 41A of the body 41 and the wall of the through hole 32, as shown in FIG. 3. The bulging portion 42 is provided in a flange shape with respect to the body 41, and is formed to have a predetermined thickness (dimension in the vertical direction). The distance between the lower surface of the body 41 and the lower surface of the bulging portion 42 is configured to be larger than the thickness of the plate-shaped portion 31 (the axial dimension of the through hole 32), and the bulging portion 42 and the plate-shaped portion 31 are opposed to each other with a gap G therebetween. The heat transfer member 40 can be made of a material having high thermal conductivity such as a heat dissipating resin, and it is possible to use, for example, PP (polypropylene), PBT (polybutylene terephthalate), PC (polycarbonate), PA (polyamide), and PPS (polyphenylene sulfide).

The heat dissipation member 50 is made of a metal having high thermal conductivity such as aluminum or an aluminum alloy, and includes a flat plate-shaped flat plate portion 51 that is opposed to the plate-shaped portion 31 of the base member 30. As shown in FIG. 2, the flat plate portion 51 has a rectangular shape corresponding to the size of the plate-shaped portion 31, and is formed to have a predetermined thickness. The flat plate portion 51 has, in its end portions in the front-rear direction, screw holes 52 to which the screws 39 can be screwed, and includes, on its upper surface, a contact portion 51A that comes into contact with the heat transfer member 40.

Assembling of the circuit assembly 10 will be described.

Figure 4:
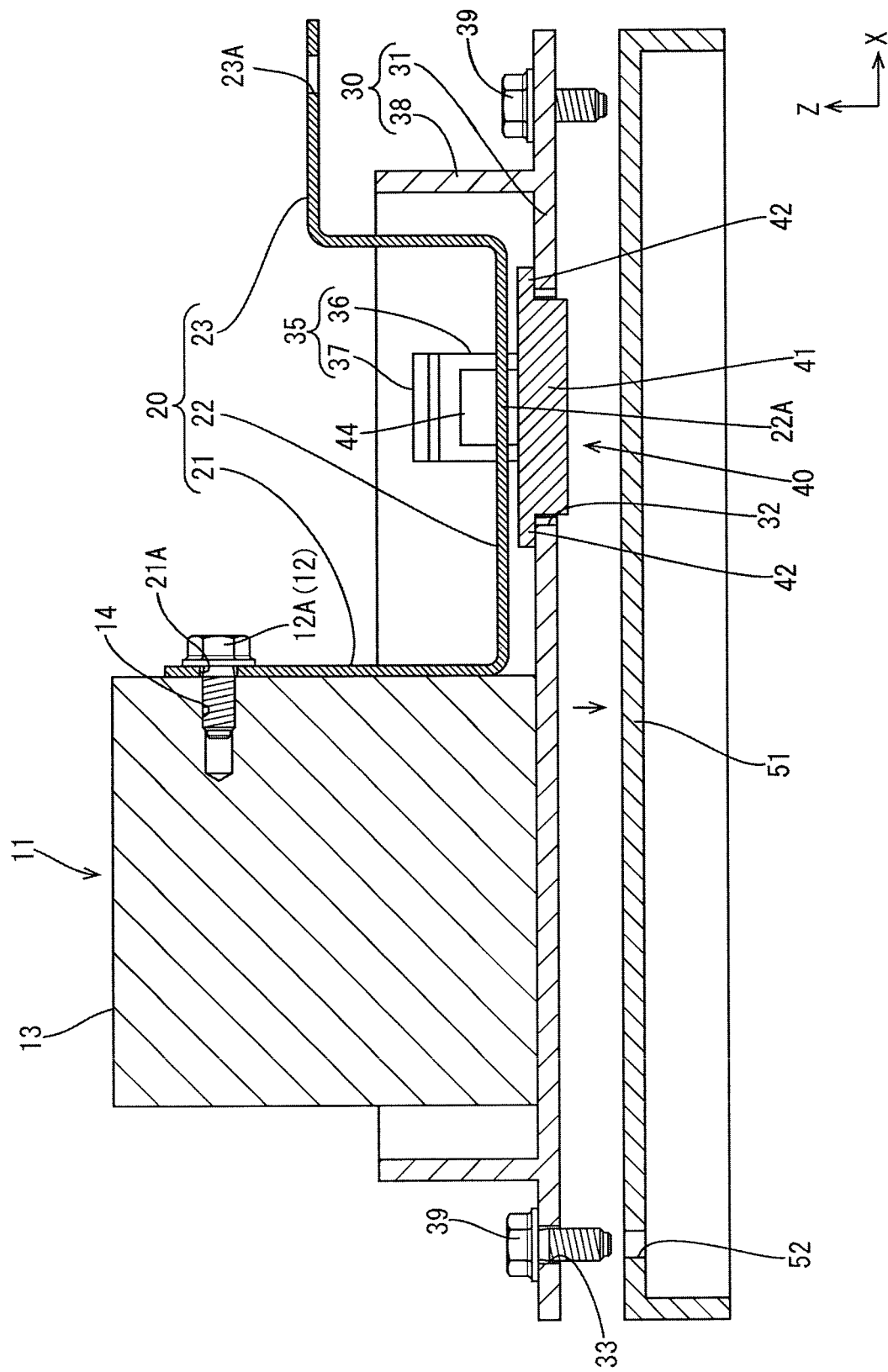
FIG. 4 is a diagram illustrating an assembling process of the circuit assembly.

The plurality of busbars 20 and 25 are fixed to the relay 11 by being fastened with the screws 12A, and the heat transfer member 40 is provided in the through hole 32 of the base member 30. Then, the second busbar 25 is fixed to the base member 30 by being fastened with the screws 19 and nuts (not shown) or the like, thus fixing the relay 11 to the base member 30. Also, another electronic component 16, another busbar 27, another component 18, and the like are fixed to the base member 30 by being fastened with the screws 19. Consequently, as shown in FIG. 4, the bulging portion 42 of the heat transfer member 40 is placed on the edge portion of the through hole 32, and a gap is formed between the heat transfer member 40 and the opposing portion 22 of the first busbar 20.

Figure 5:
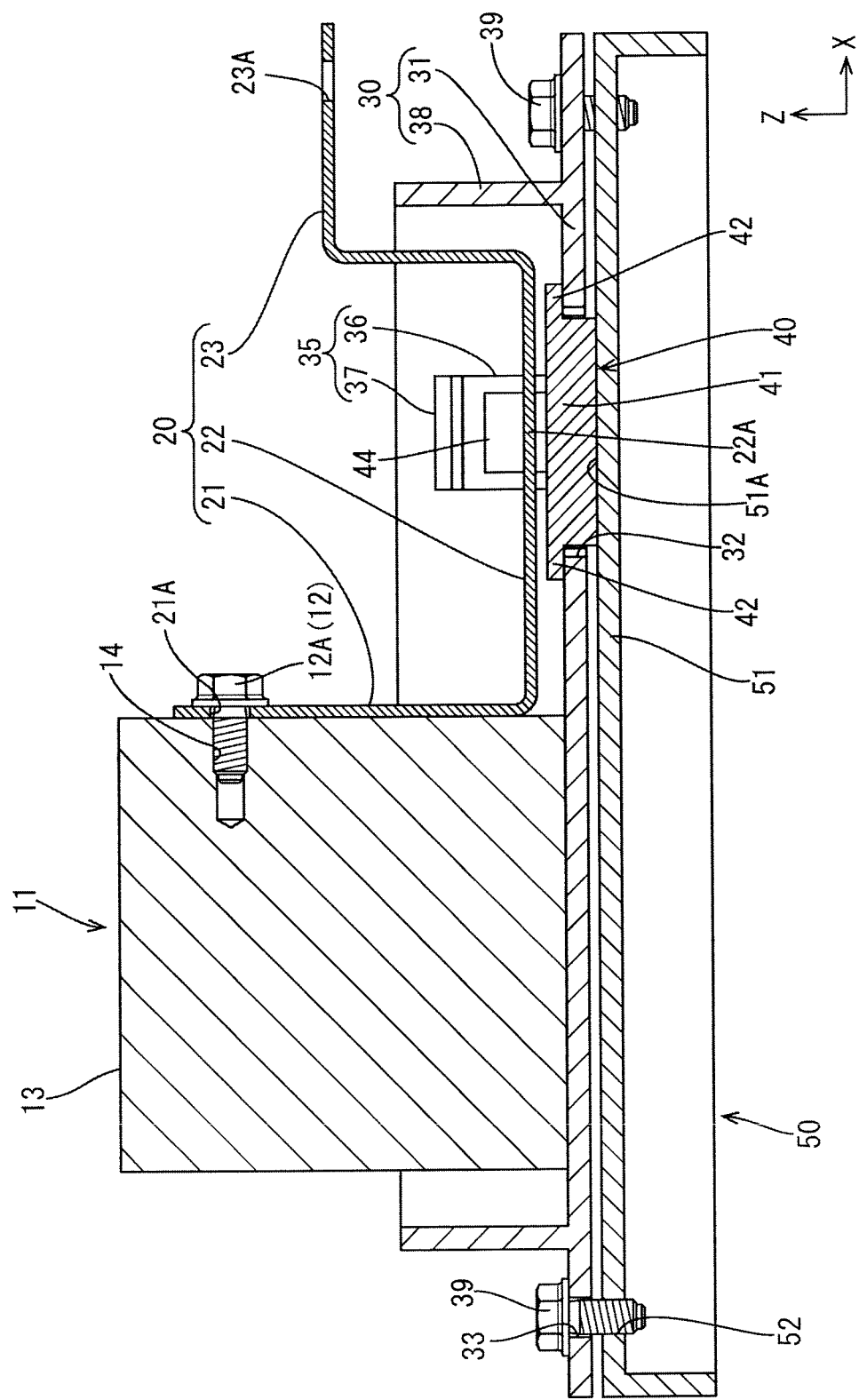
FIG. 5 is a vertical cross-sectional view of a state in which a heat transfer member has moved from the state shown in FIG. 4 to a position at which the heat transfer member is into contact with a heat dissipation member.

Next, the base member 30 to which the relay 11, the heat transfer member 40, and the like have been attached is disposed on the heat dissipation member 50. As the base member 30 is fastened to the heat dissipation member 50 with the screws 39, the contact portion 51A of the heat dissipation member 50 comes into contact with the heat transfer member 40, as shown in FIG. 5. Furthermore, as shown in FIG. 2, as the screws 39 are fastened to exert a predetermined torque, the gap between the plate-shaped portion 31 of the base member 30 and the heat dissipation member 50 is eliminated, and a gap is formed between the plate-shaped portion 31 and the bulging portion 42, causing the upper surface of the heat transfer member 40 to bias the heat transfer contact portion 22A of the first busbar 20 upward, as a result of which the first busbar 20 is elastically deformed by a small amount, thus forming a circuit assembly 10.

According to the present embodiment, the following actions and effects can be achieved.

The circuit assembly 10 includes a relay 11 (heat generation component) that includes a terminal 12 and generates heat when energized; a base member 30 to which the relay 11 is attached and in which a through hole 32 is formed; a heat dissipation member 50 that is provided under the base member 30 (the side opposite to the side on which the relay 11 is attached); a first busbar 20 (busbar) that is connected to the terminal 12 of the relay 11 at a position spaced apart from the base member 30; and a heat transfer member 40 that is inserted into the through hole 32 so as to be movable in a direction along the axial direction of the through hole 32 and that comes into contact with the first busbar 20 and the heat dissipation member 50.

According to the present embodiment, the heat of the relay 11 can be dissipated to the outside from the heat dissipation member 50 via the first busbar 20 and the heat transfer member 40. Thus, by using the first busbar 20 that is connected to the terminal 12 of the relay 11 at a position spaced apart from the base member 30 for heat dissipation of the relay 11, the shape of the first busbar 20 can be easily modified, thus making it possible to easily improve the heat dissipation by increasing the contact area with the transfer member 40. Here, for example, when the heat transfer member 40 that comes into contact with the first busbar 20 and the heat dissipation member 50 is fixed to the base member 30, there is concern that due to a dimensional accuracy error between the first busbar 20, the heat transfer member 40, the base member 30 and the like, the first busbar 20 and the heat transfer member 40 or the heat transfer member 40 and the heat dissipation member 50 may not sufficiently come in close contact with each other, or may come into contact with each other with excessive pressure, resulting in reduced thermal conductivity and hence reduced heat dissipation. According to the present embodiment, the heat transfer member 40 is inserted into the through hole 32 of the base member 30 so as to be movable in a direction along the axial direction of the through hole 32. Therefore, even when there is a dimensional accuracy error between the first busbar 20, the heat transfer member 40, the base member 30, and the like, the dimensional accuracy error can be absorbed by the heat transfer member 40 moving in the through hole 32 in the direction along the axial direction of the through hole 32. Accordingly, a reduction in the thermal conductivity in a path extending from the first busbar 20 to the heat dissipation member 50 via the heat transfer member 40 can be suppressed, thus making it possible to improve the heat dissipation.

Additionally, the first busbar 20 is elastically deformed by being pressed by the heat transfer member 40.

With this configuration, the heat transfer member 40 can be easily brought into close contact with the first busbar 20 due to elastic deformation of the first busbar 20, thus making it possible to improve the thermal conductivity between the first busbar 20 and the heat transfer member 40.

The fastening portions 35 configured to restrict movement of the heat transfer member 40 that exceeds a predetermined amount are fixed to the base member 30.

With this configuration, it is possible to inhibit excessive deformation of the first busbar 20 caused by an increased amount of movement of the heat transfer member 40 relative to the base member 30.

The lower surface of the first busbar 20 is in surface contact with the upper surface of the heat transfer member 40. With this configuration, the contact area between the first busbar 20 and the heat transfer member 40 can be increased, thus making it possible to improve heat dissipation.

The heat transfer member 40 includes a body 41 that is passed through the through hole 32, and a bulging portion 42 that bulges in the radial direction of the body 41 and that is not inserted into the through hole 32, and the bulging portion 42 is disposed between the first busbar 20 and the base member 30.

With this configuration, the contact area between the first busbar 20 and the heat transfer member 40 can be increased by the bulging portion 42 of the heat transfer member 40, thus making it possible to improve heat dissipation. Additionally, the interval between the first busbar 20 and the base member 30 can be maintained by the bulging portion 42.

Embodiment 2

Figure 6:
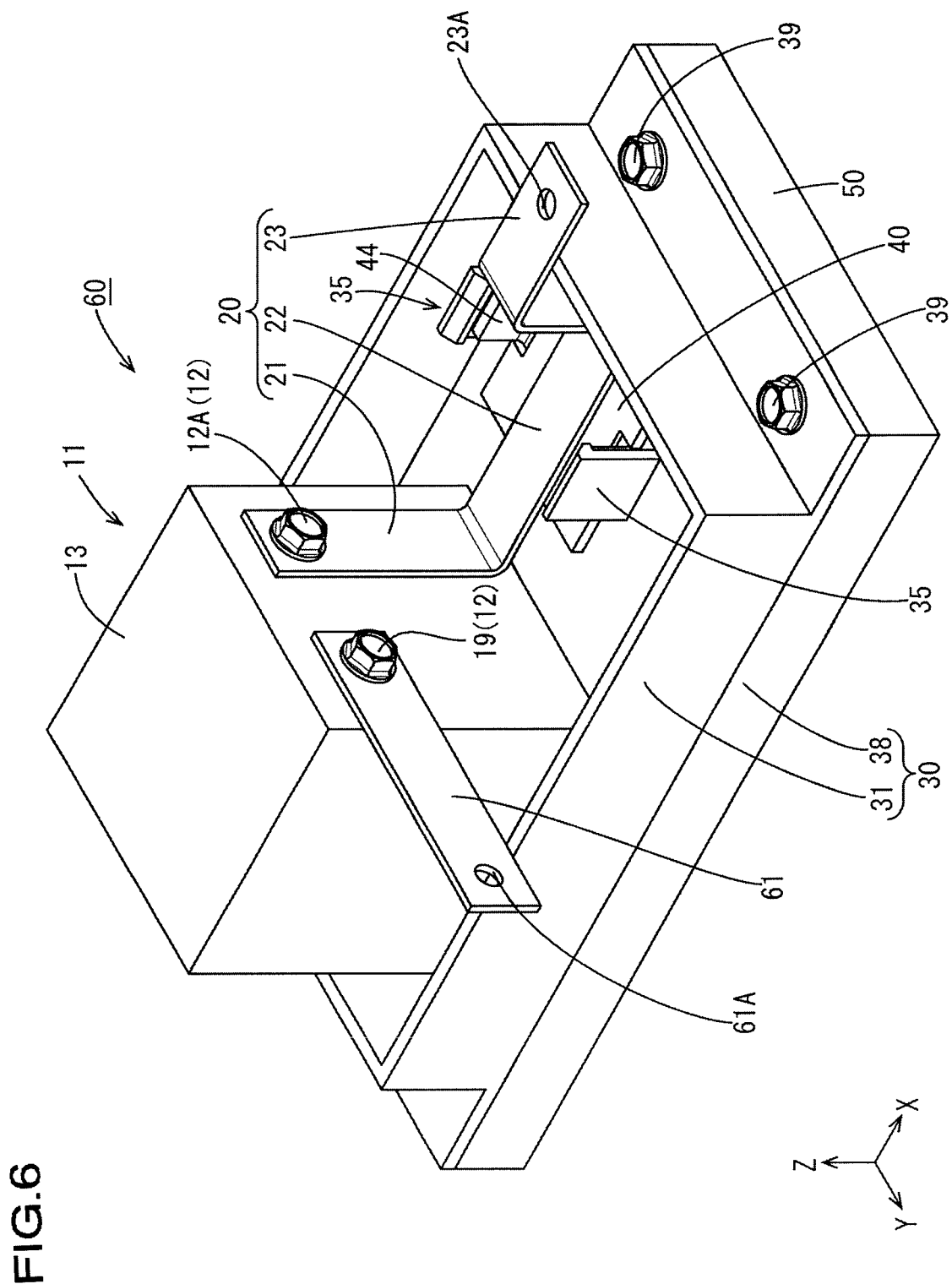
FIG. 6 is a perspective view showing a circuit assembly according to Embodiment 2.

Next, Embodiment 2 will be described with reference to FIG. 6. In the following, the same components as those of Embodiment 1 are denoted by the same reference numerals, and descriptions thereof are omitted.

A circuit assembly 60 according to Embodiment 2 includes a second busbar 61 in which a screw hole 61A is formed on one end side thereof, and a terminal 12 that is fastened to the relay 11 with a screw 19 on the other end side thereof. In the circuit assembly 60, another electronic component 16 in Embodiment 1 is not fastened to the relay 11 with a screw, and the second busbar 61 having a rectangular flat plate shape is fastened to the relay 11 with a screw. The second busbar 61 is configured to extend outward (laterally) so as to be connectable to an external terminal (not shown).

Embodiment 3

Next, Embodiment 3 will be described with reference to FIGS. 7 to 11. The first busbar 20 according to the above-described embodiments is configured to be energized in response to the operation of the relay 11. However, in Embodiment 3, a heat dissipating busbar 71 that is not energized in response to operation of the relay 11 is used as a first busbar 71. In the following, the same components as those of the above-described embodiments are denoted by the same reference numerals, and descriptions thereof are omitted.

Figure 7:
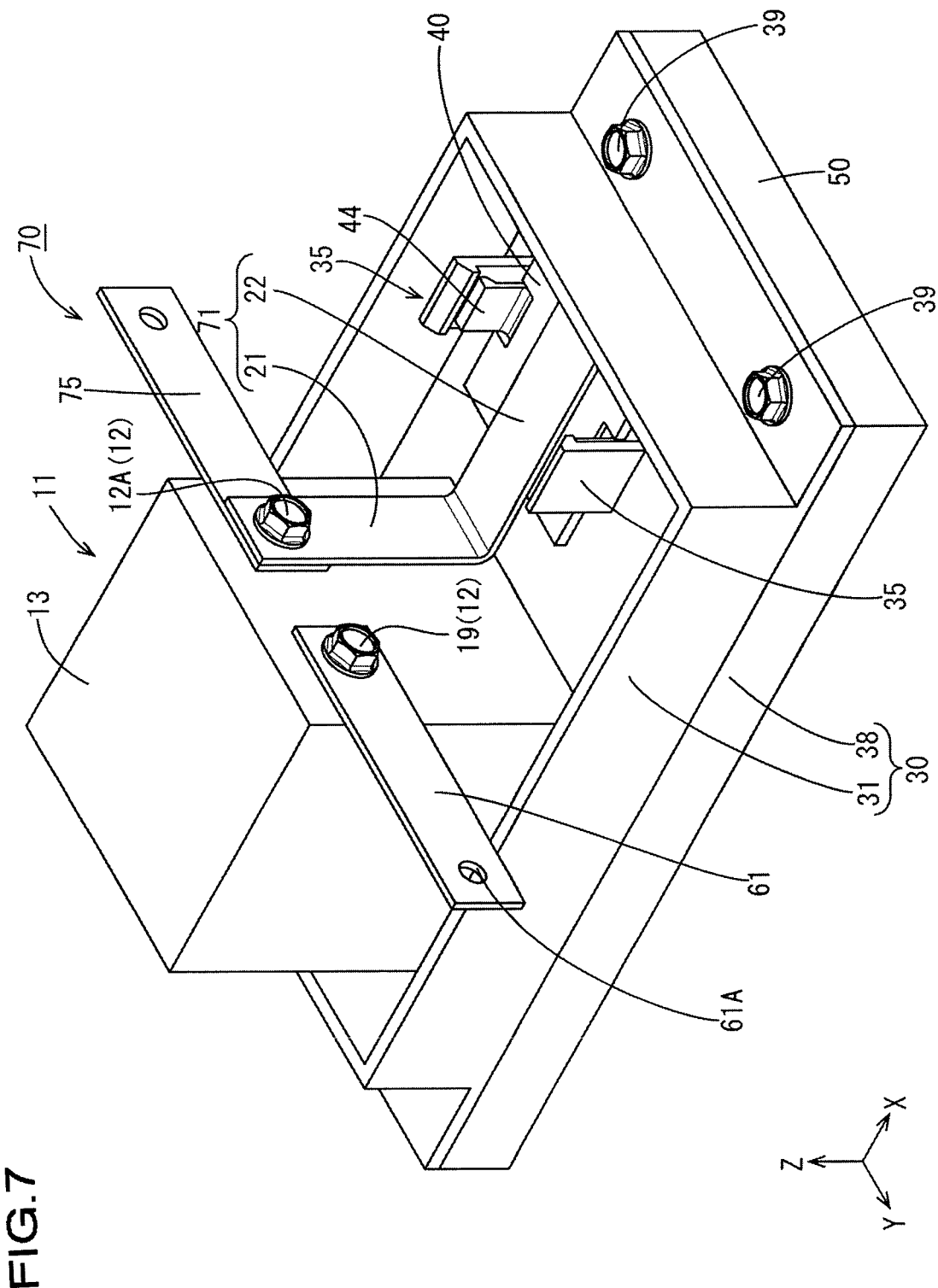
FIG. 7 is a perspective view showing a circuit assembly according to Embodiment 3.
Figure 8:
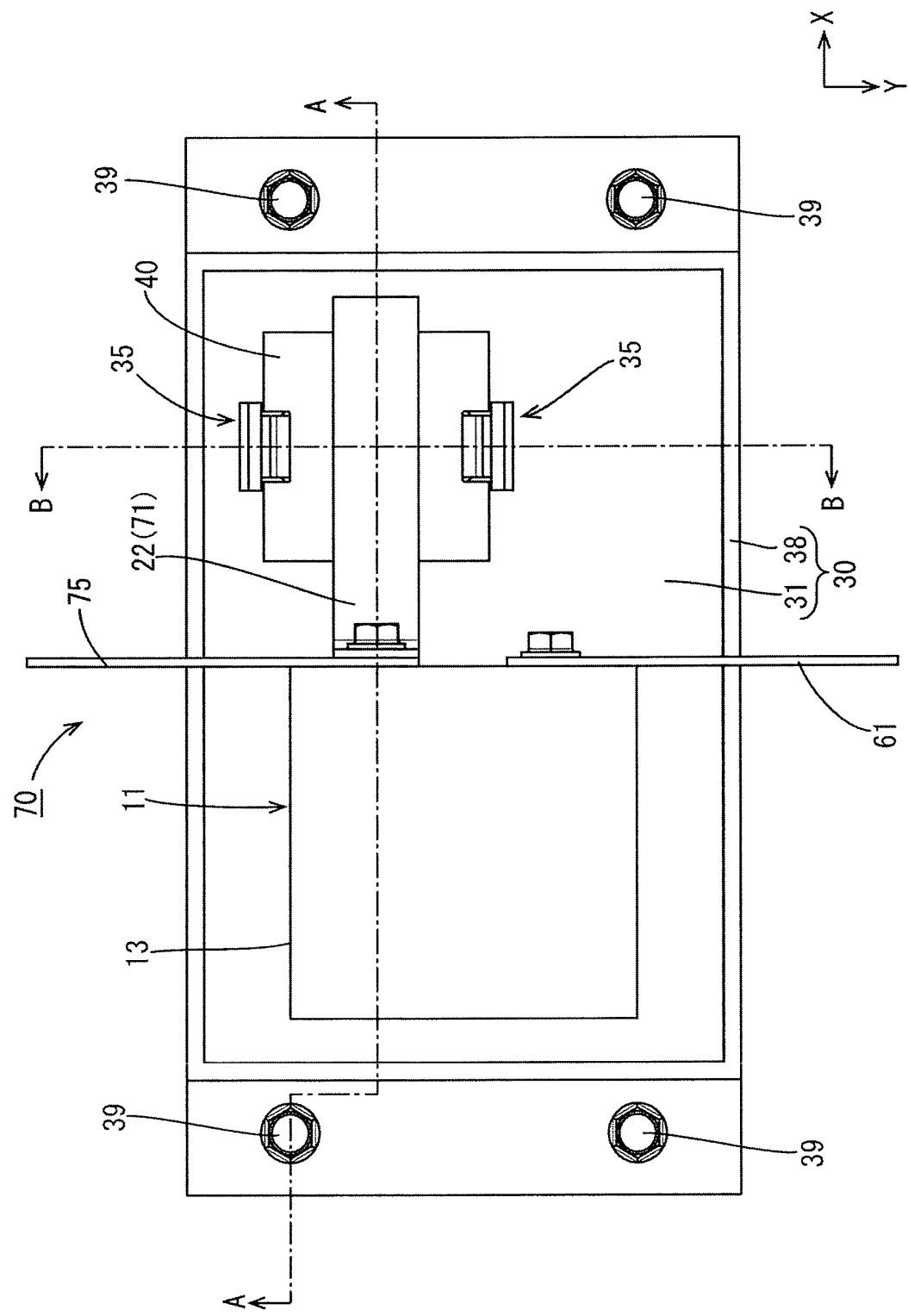
FIG. 8 is a plan view showing the circuit assembly.
Figure 9:
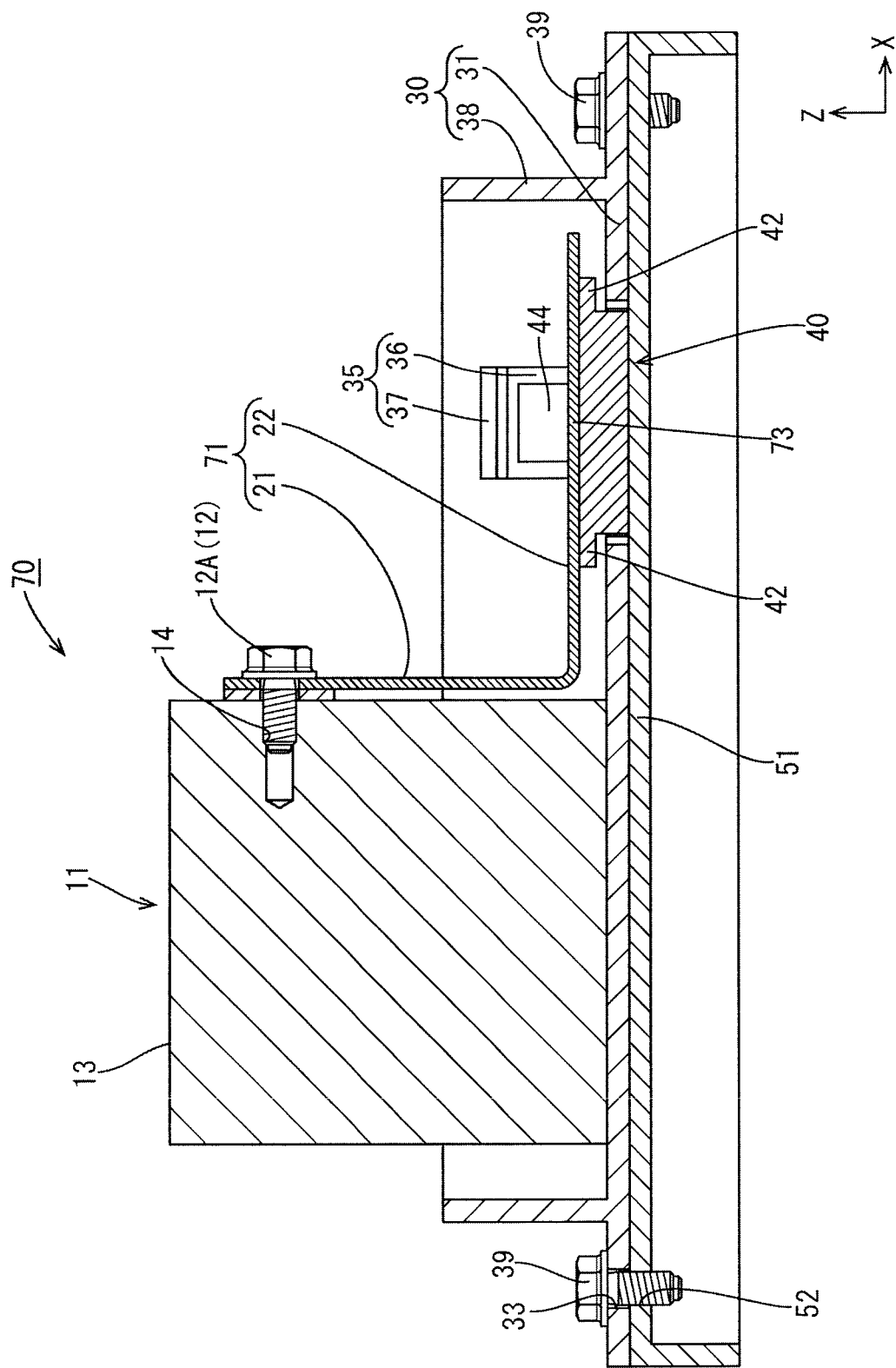
FIG. 9 is a cross-sectional view taken along the line A-A in FIG. 8.
Figure 10:
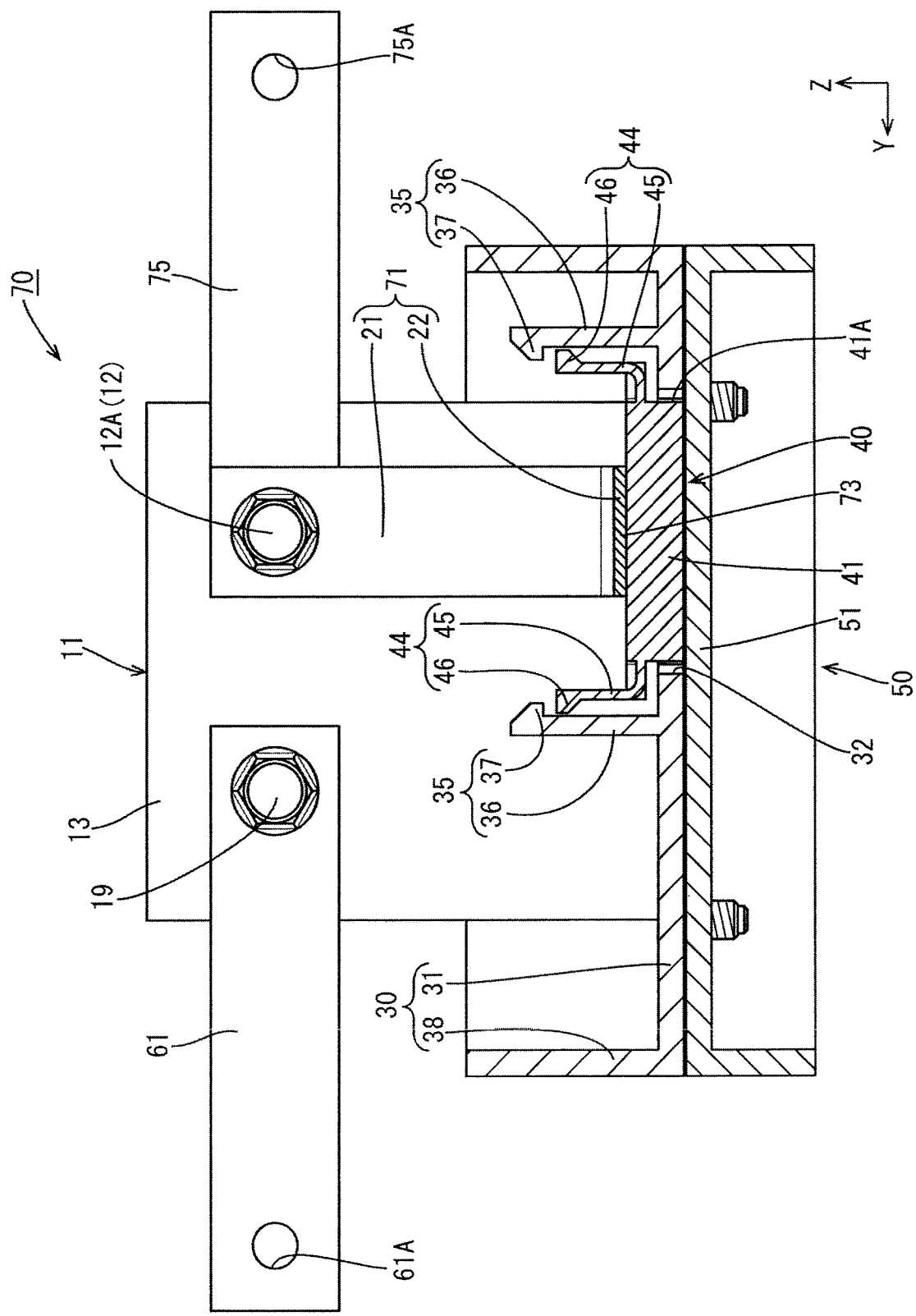
FIG. 10 is a cross-sectional view taken along the line B-B in FIG. 8.

As shown in FIGS. 7 and 9, one terminal 12 of the relay 11 in a circuit assembly 70 is connected to both the first busbar 71 and a third busbar 75 by being fastened to one screw hole 14 for the screw 12A. The first busbar 71 is formed as a heat dissipating busbar 71 provided dissipating heat from the relay 11, and does not include the external connection portion 23 of the first busbar 20 of Embodiment 1. As shown in FIG. 10, the opposing portion 22 of the plate-shaped portion 31 of the base member 30 in the heat dissipating busbar 71 includes a heat transfer contact portion 73 that comes into contact with the heat transfer member 40. The third busbar 75 has a screw hole 75A formed therein, and extends in a direction orthogonal to the first busbar 71. The third busbar 75 is configured to be connectable to an external terminal.

Figure 11:
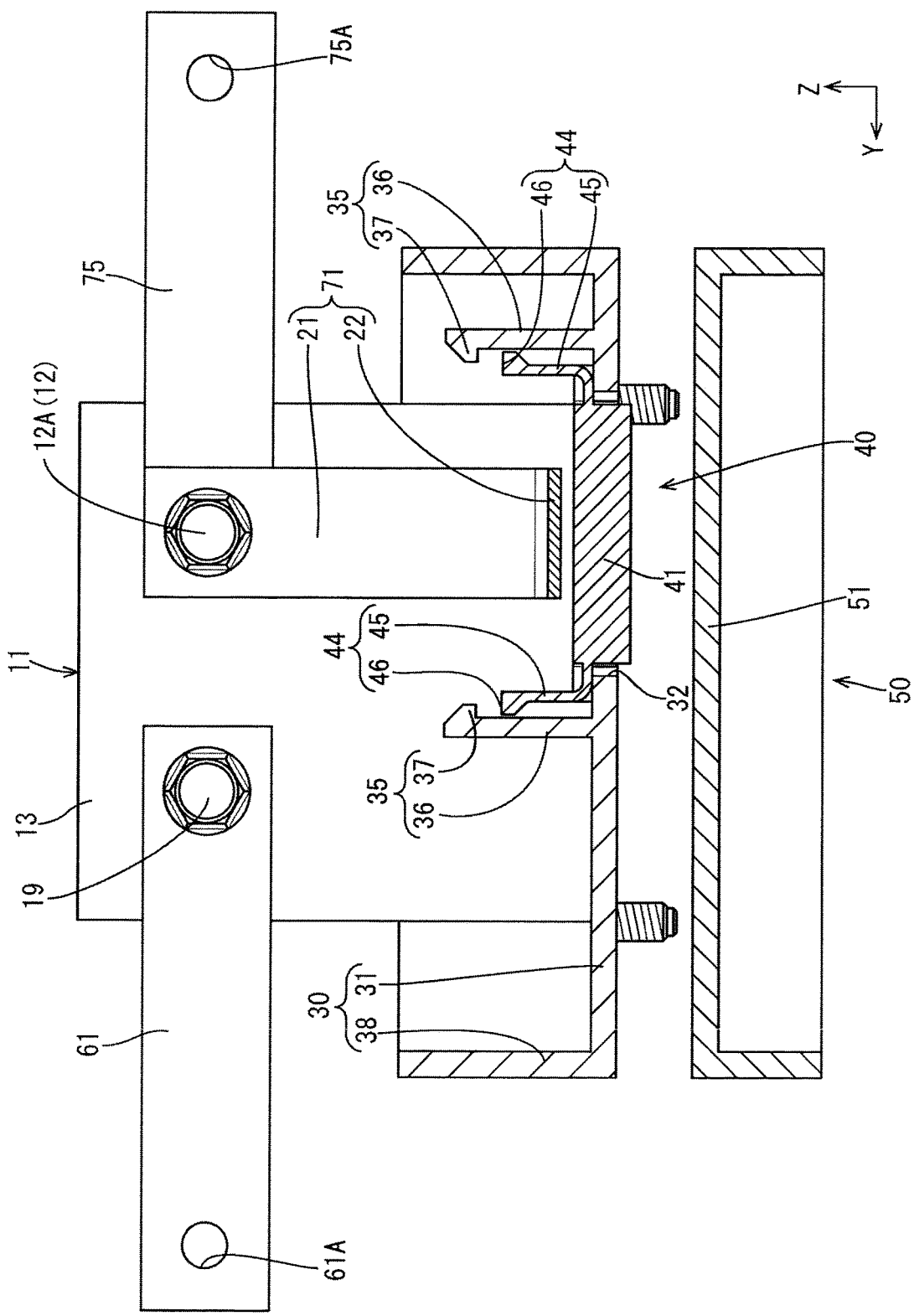
FIG. 11 is a diagram illustrating an assembling process of the circuit assembly.

As shown in FIG. 11, to assemble the circuit assembly 70, the base member 30 to which the relay 11, the heat transfer member 40, and the like have been attached is disposed on the heat dissipation member 50, and the base member 30 is fastened to the heat dissipation member 50 using the screws 39. As shown in FIG. 10, the heat transfer member 40 is moved upward relative to the base member 30, causing the heat transfer member 40 to bias the first busbar 71 upward, as a result of which the first busbar 71 is elastically deformed by a small amount, thus forming the circuit assembly 70.

According to Embodiment 3, the first busbar 71 is the heat dissipating busbar 71 that is not energized when the relay 11 is in operation, and it is therefore possible to modify the shape of the first busbar 71 regardless of the energization path.

Embodiment 4

Next, Embodiment 4 will be described with reference to FIGS. 12 to 14. Embodiment 4 uses a first busbar 81 for which elastic deformation has been facilitated by changing the shape of the first busbar 71 of Embodiment 3. In the following, the same components as those of Embodiment 3 are denoted by the same reference numerals, and descriptions thereof are omitted.

Figure 12:
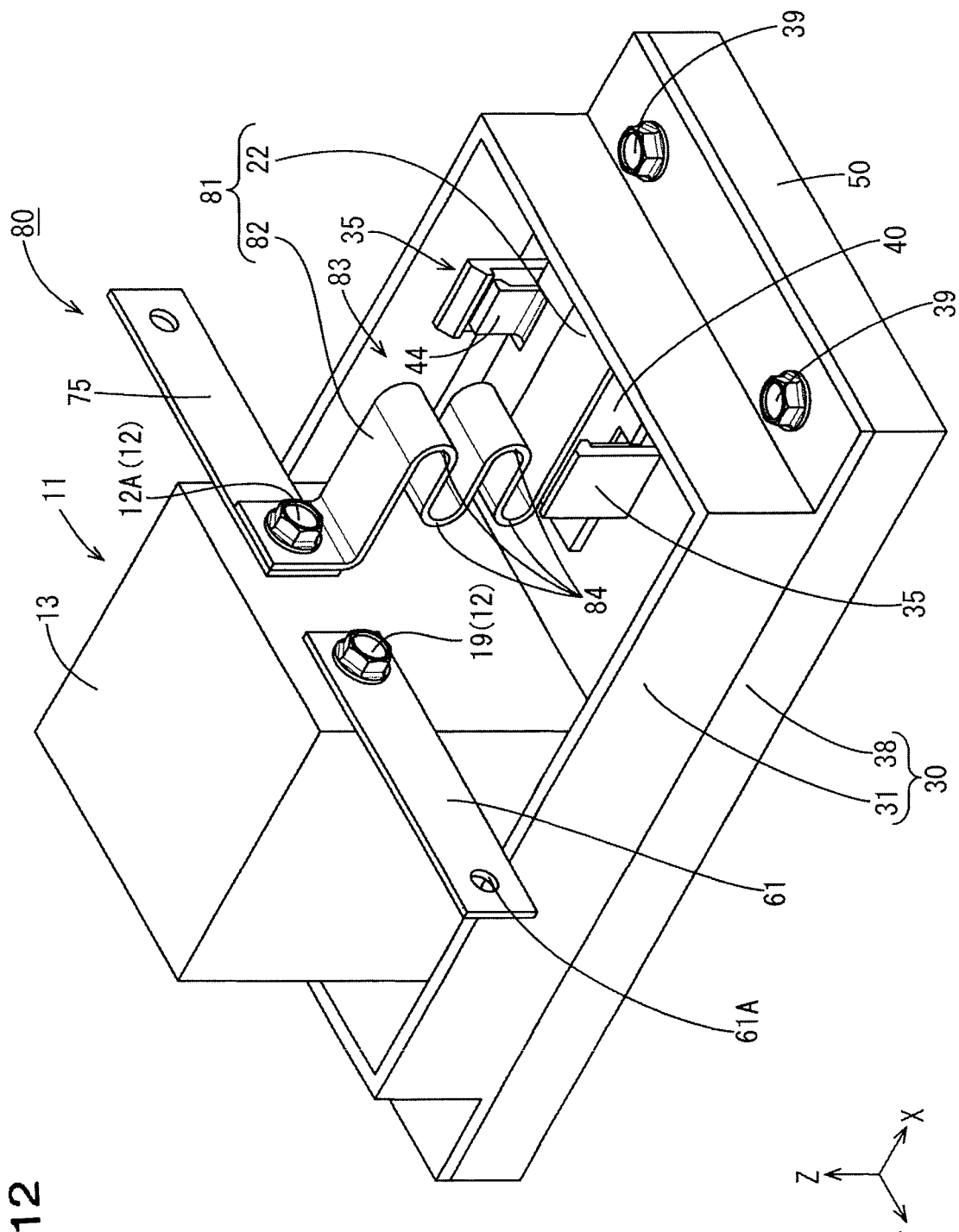
FIG. 12 is a perspective view showing a circuit assembly according to Embodiment 4.
Figure 13:
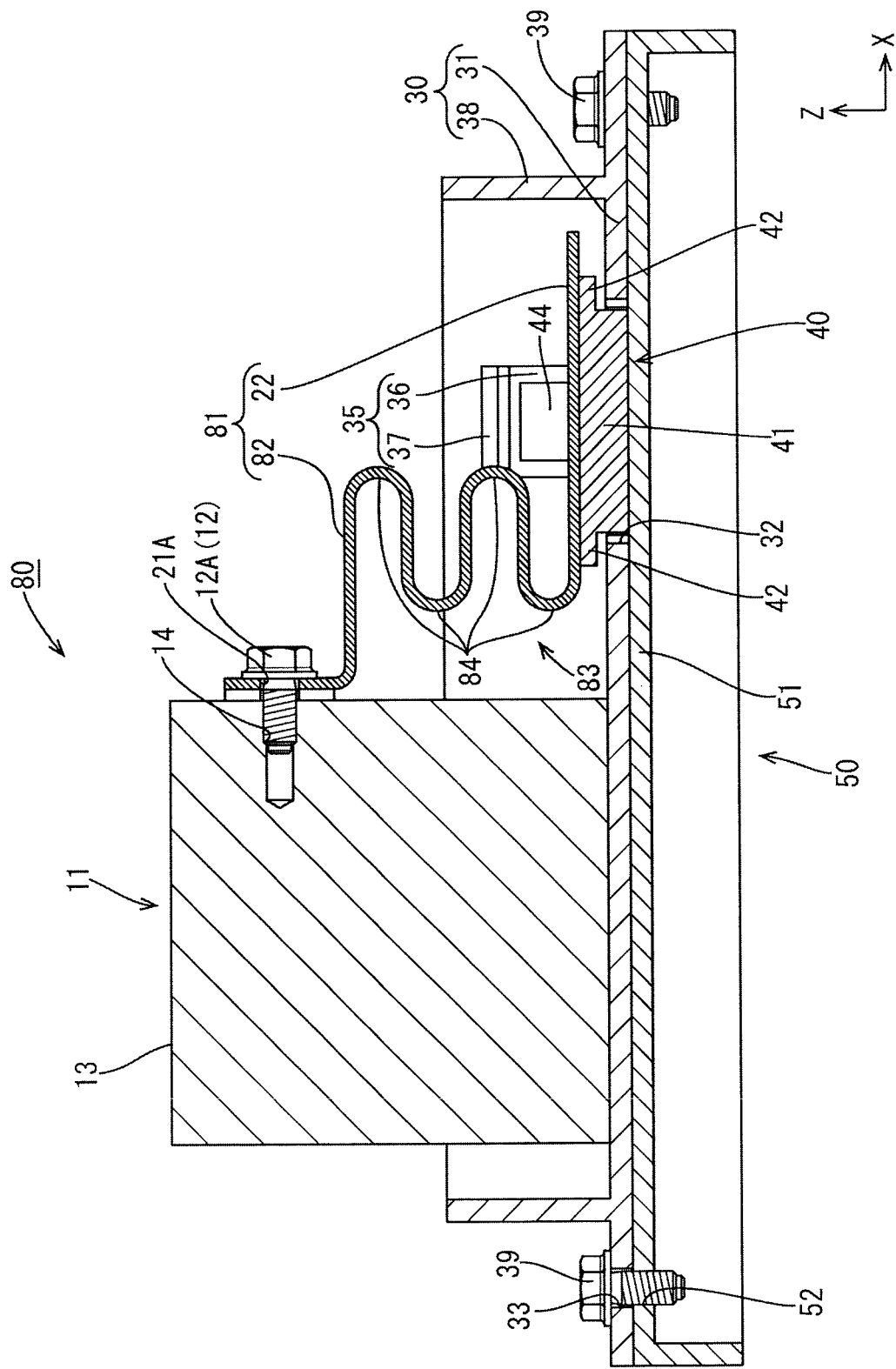
FIG. 13 is a vertical cross-sectional view showing the circuit assembly.

As shown in FIGS. 12 and 13, the first busbar 81 of a circuit assembly 80 includes a terminal connection portion 82 that is connected to the terminal 12 of the relay 11 and extends downward, and an opposing portion 22. A portion of the terminal connection portion 82 that is located downward of a portion that is fastened by the screw 12A is spaced apart from the front surface of the relay 11, and includes an elastic portion 83 that is bent so as to facilitate elastic deformation. The elastic portion 83 has a plurality of folded portions 84 that are continuous in the vertical direction.

Figure 14:
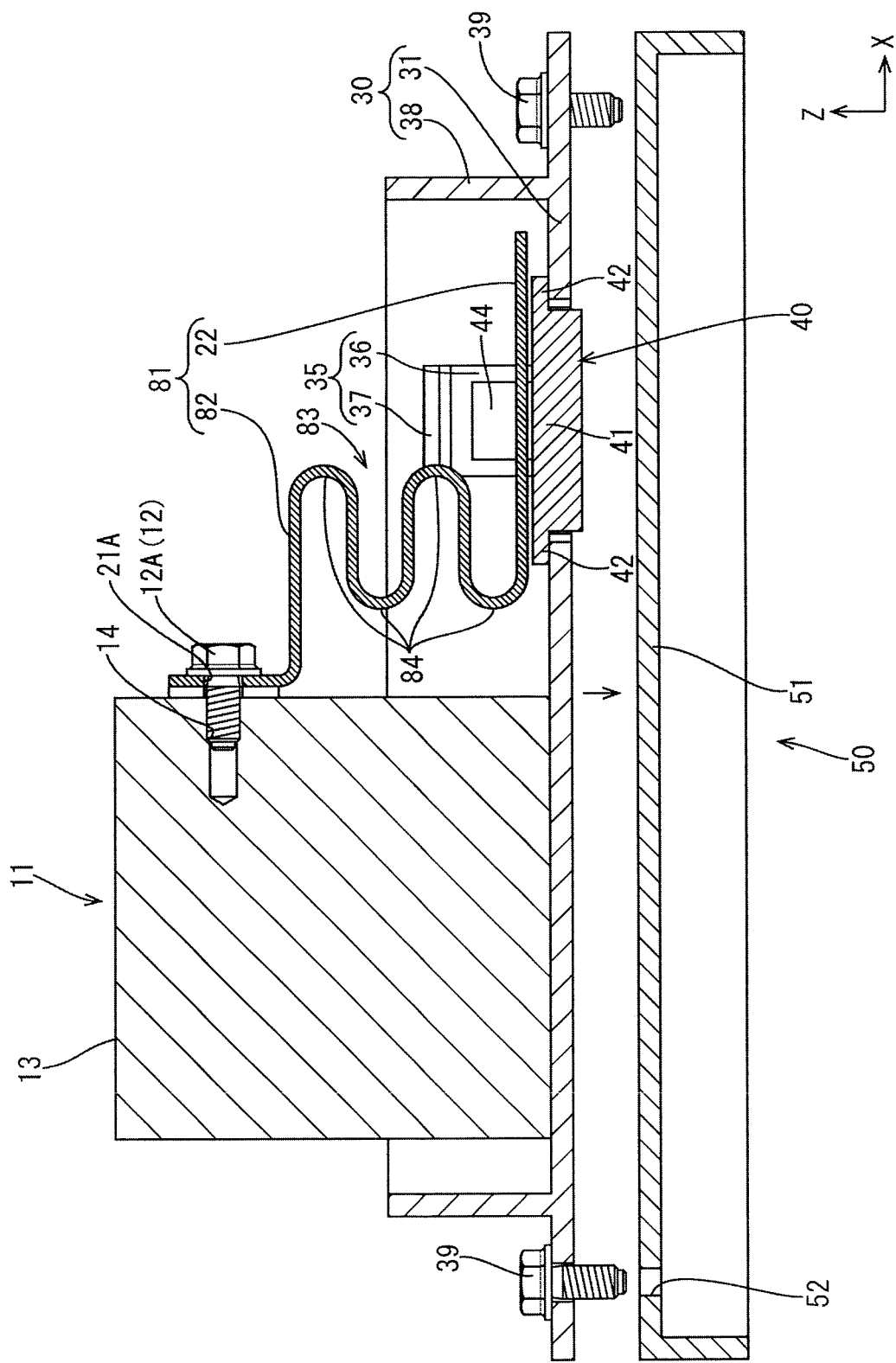
FIG. 14 is a diagram illustrating an assembling process of the circuit assembly.

To assemble the circuit assembly 80, as shown in FIG. 14, the base member 30 to which the relay 11, the heat transfer member 40, and the like have been attached is disposed on the heat dissipation member 50, and the base member 30 is fastened to the heat dissipation member 50 with the screws 39. As as shown in FIG. 13, the heat transfer member 40 is moved upward relative to the base member 30, and the heat transfer member 40 abuts against the first busbar 81 to bias the first busbar 81 upward, as a result of which the first busbar 81 is elastically deformed slightly, thus forming the circuit assembly 80.

Embodiment 5

Figure 15:
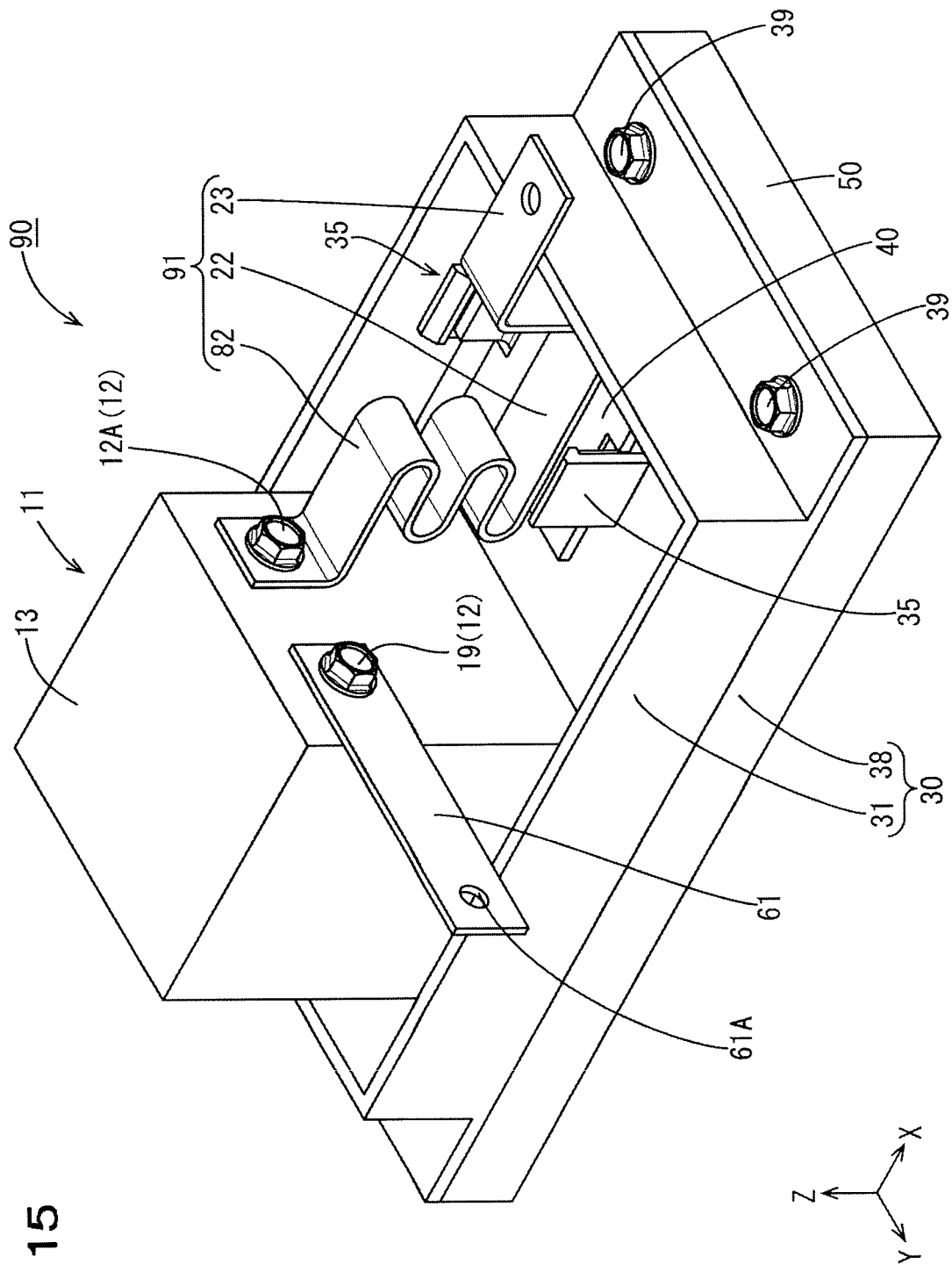
FIG. 15 is a perspective view showing a circuit assembly according to Embodiment 5.
Figure 16:
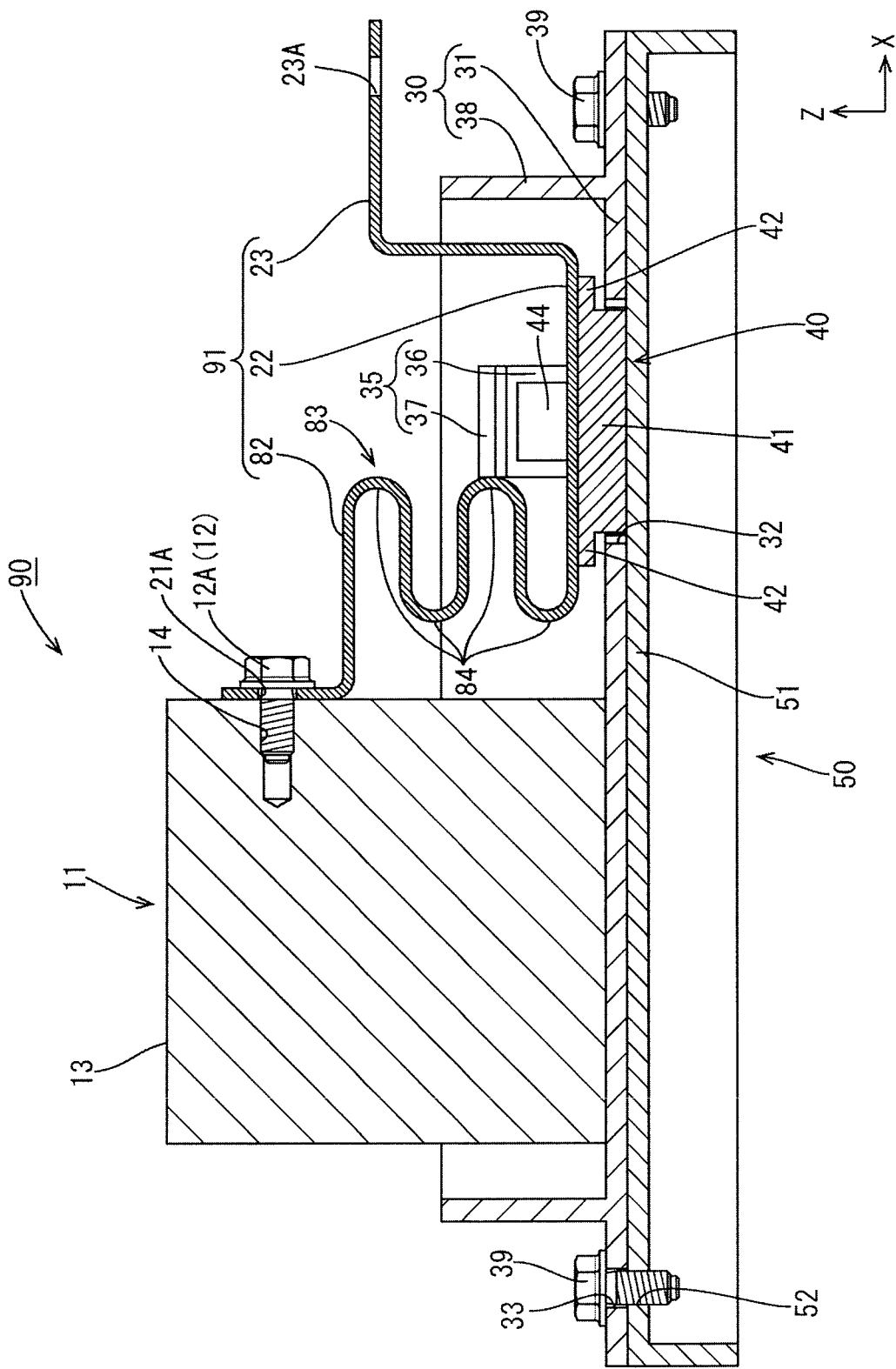
FIG. 16 is a vertical cross-sectional view showing the circuit assembly

Next, Embodiment 5 will be described with reference to FIGS. 15 to 17. Embodiment 5 uses a first busbar 91 that is formed by changing the shape of the first busbar 81 of Embodiment 4, and is thus configured to be able to be energized. In the following, the same components as those of Embodiment 4 are denoted by the same reference numerals, and descriptions thereof are omitted. The first busbar 91 of a circuit assembly 90 includes the terminal connection portion 82 that is connected to the terminal 12 of the relay 11, the opposing portion 22, and the external connection portion 23, but does not include the third busbar 75.

Figure 17:
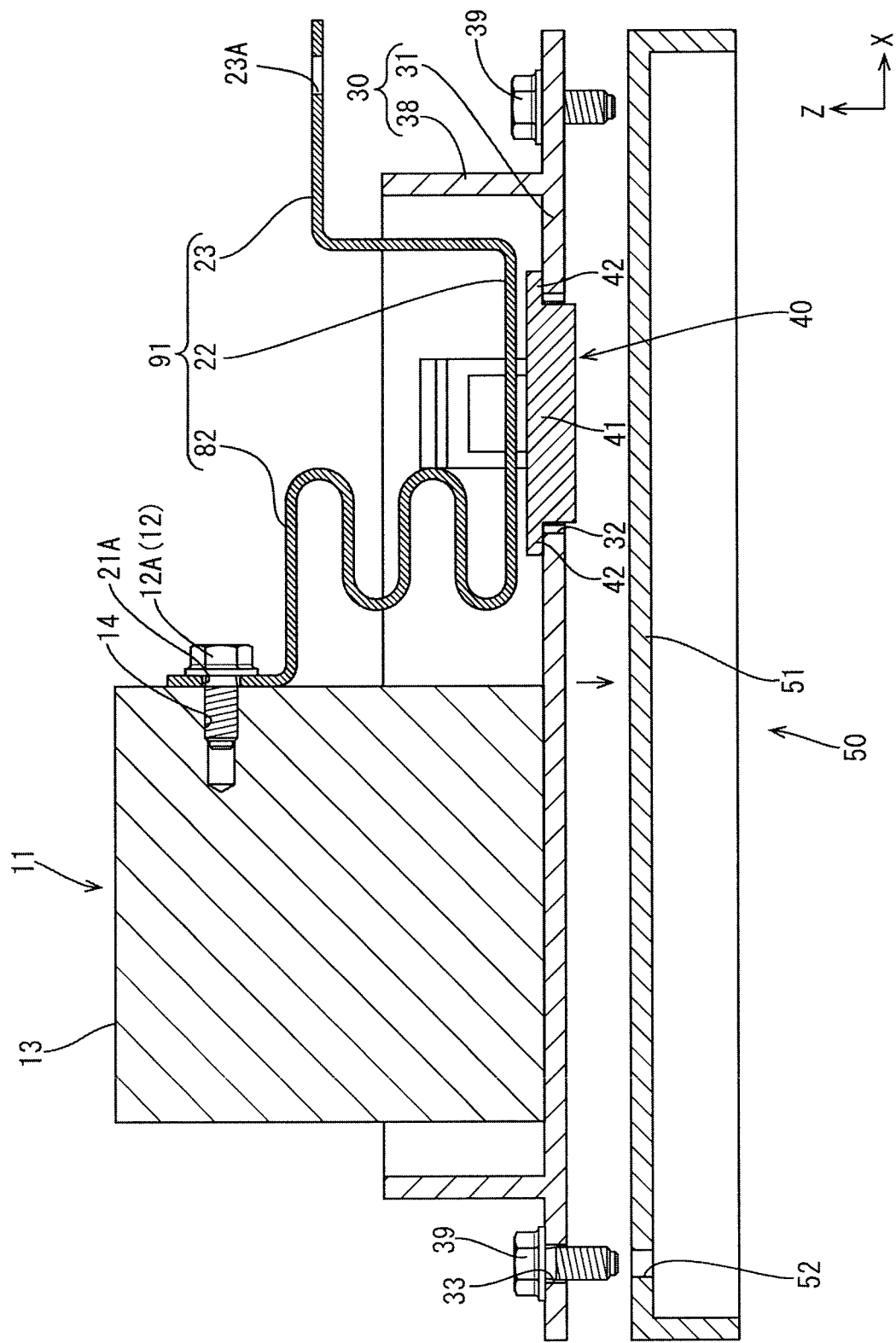
FIG. 17 is a diagram illustrating an assembling process of the circuit assembly.

To assemble the circuit assembly 90, as shown in FIG. 17, the base member 30 to which the relay 11, the heat transfer member 40, and the like have been attached is disposed on the heat dissipation member 50, and the base member 30 is fastened to the heat dissipation member 50 using the screws 39. As shown in FIG. 16, the heat transfer member 40 is moved upward relative to the base member 30, and the heat transfer member 40 abuts against the first busbar 91 to bias the first busbar 91 upward, as a result of which the first busbar 91 is elastically deformed slightly, thus forming the circuit assembly 90.

Embodiment 6

Next, Embodiment 6 will be described with reference to FIGS. 18 to 20. Embodiment 6 uses a first busbar 101 including an elastic portion 103 that is formed by changing the shape of the elastic portion 83 of Embodiment 4. In the following, the same components as those of Embodiment 4 are denoted by the same reference numerals, and descriptions thereof are omitted.

Figure 18:
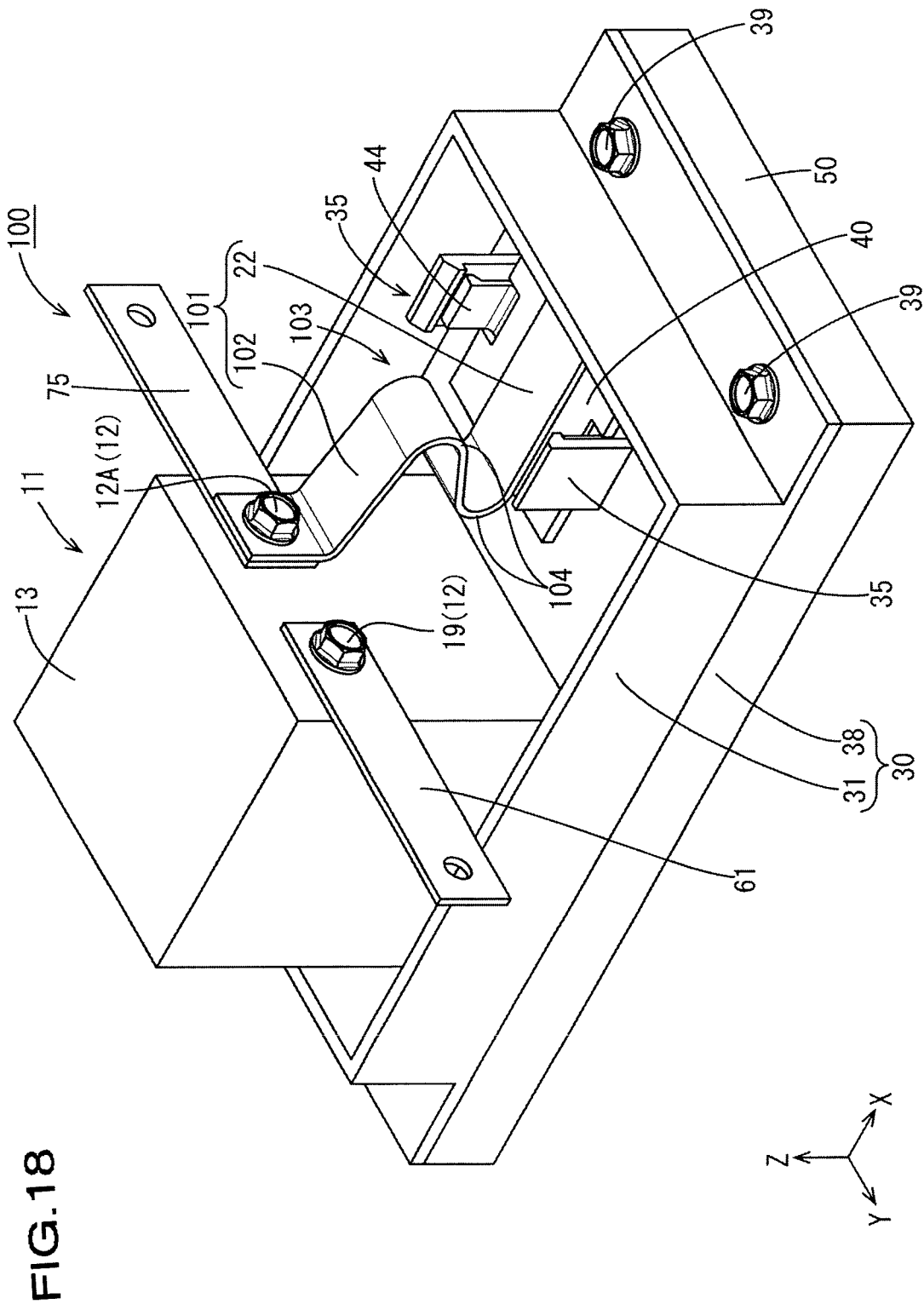
FIG. 18 is a perspective view showing a circuit assembly according to Embodiment 6.
Figure 19:
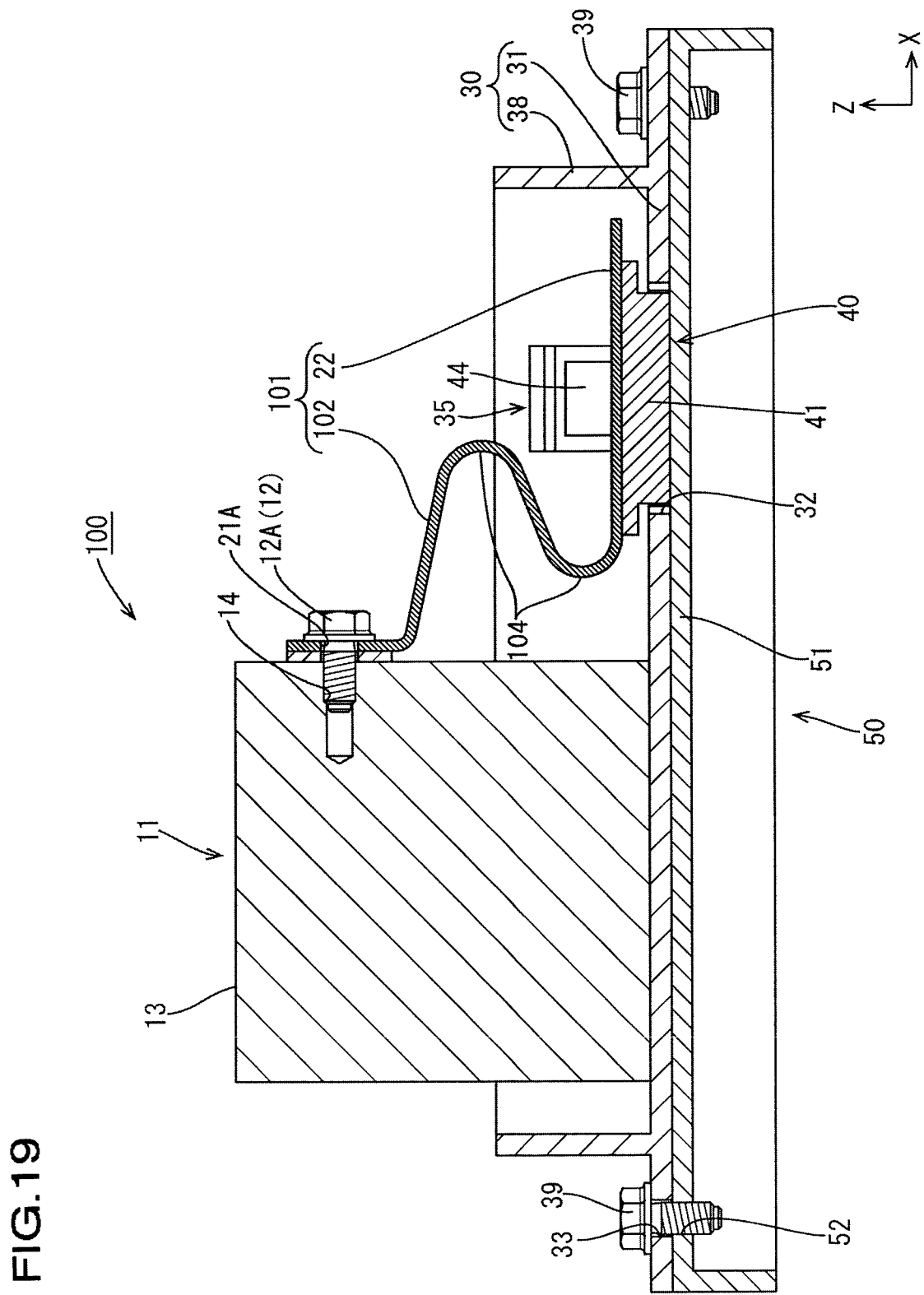
FIG. 19 is a vertical cross-sectional view showing the circuit assembly.

As shown in FIG. 18, the first busbar 101 of a circuit assembly 100 includes a terminal connection portion 102 that is connected to the terminal 12 of the relay 11, and the opposing portion 22. A portion of the terminal connection portion 102 that is located downward of a portion that is fastened by the screw 12A is spaced apart from the front surface of the relay 11, and includes an elastic portion 103 that is bent so as be elastically deformable. The elastic portion 103 includes a bent portion 104 that is bent a number of turns and with curvatures that are smaller than those for the elastic portion 83 of Embodiment 4.

Figure 20:
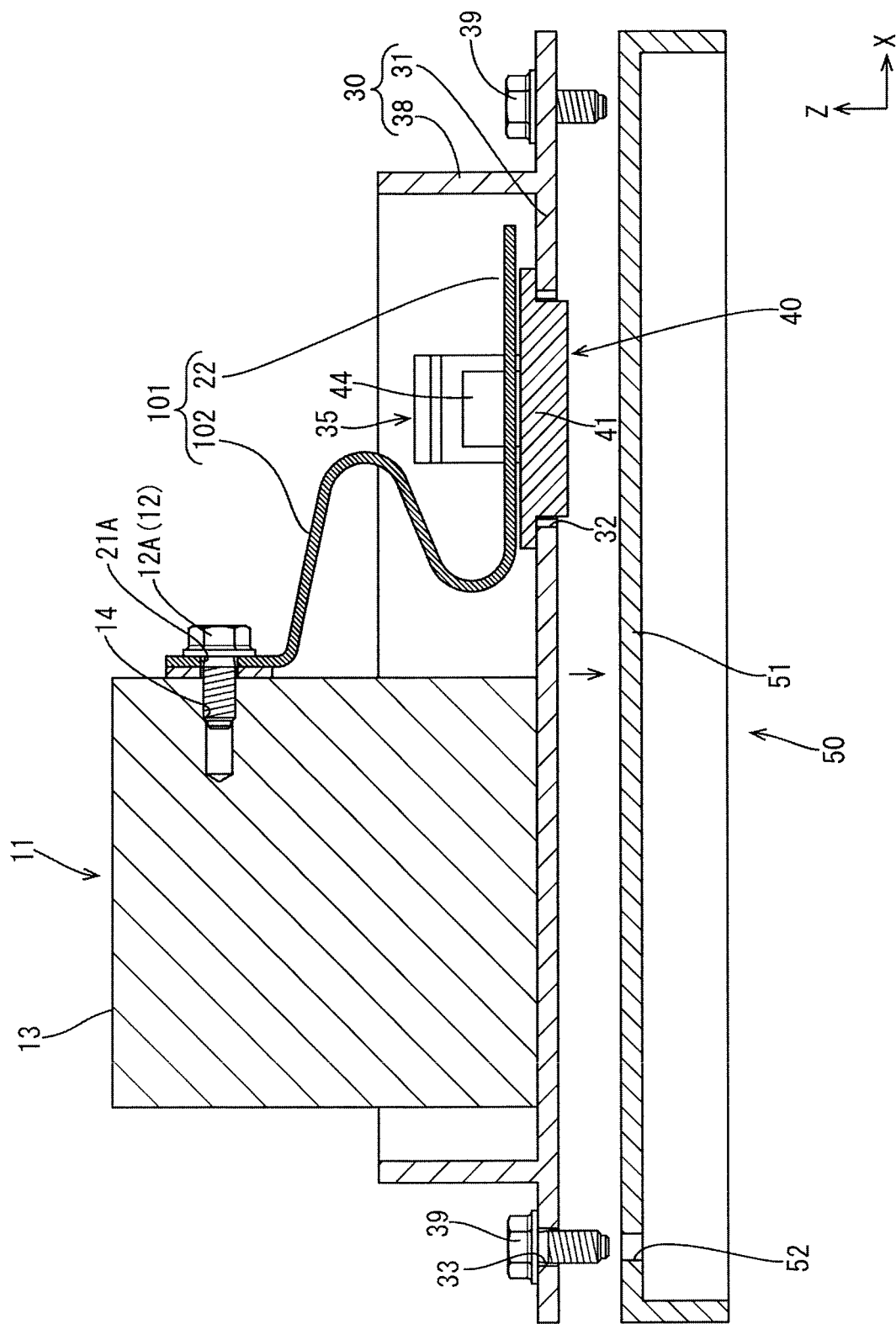
FIG. 20 is a diagram illustrating an assembling process of the circuit assembly.

To assemble the circuit assembly 100, as shown in FIG. 20, the base member 30 to which the relay 11, the heat transfer member 40, and the like have been attached is disposed on the heat dissipation member 50, and the base member 30 is fastened to the heat dissipation member 50 with the screws 39. As shown in FIG. 19, the heat transfer member 40 is moved upward relative to the base member 30, and the heat transfer member 40 abuts against the first busbar 101 to bias the first busbar 101 upward, as a result of which the first busbar 101 is elastically deformed by a small amount, thus forming the circuit assembly 100.

Embodiment 7

Figure 21:
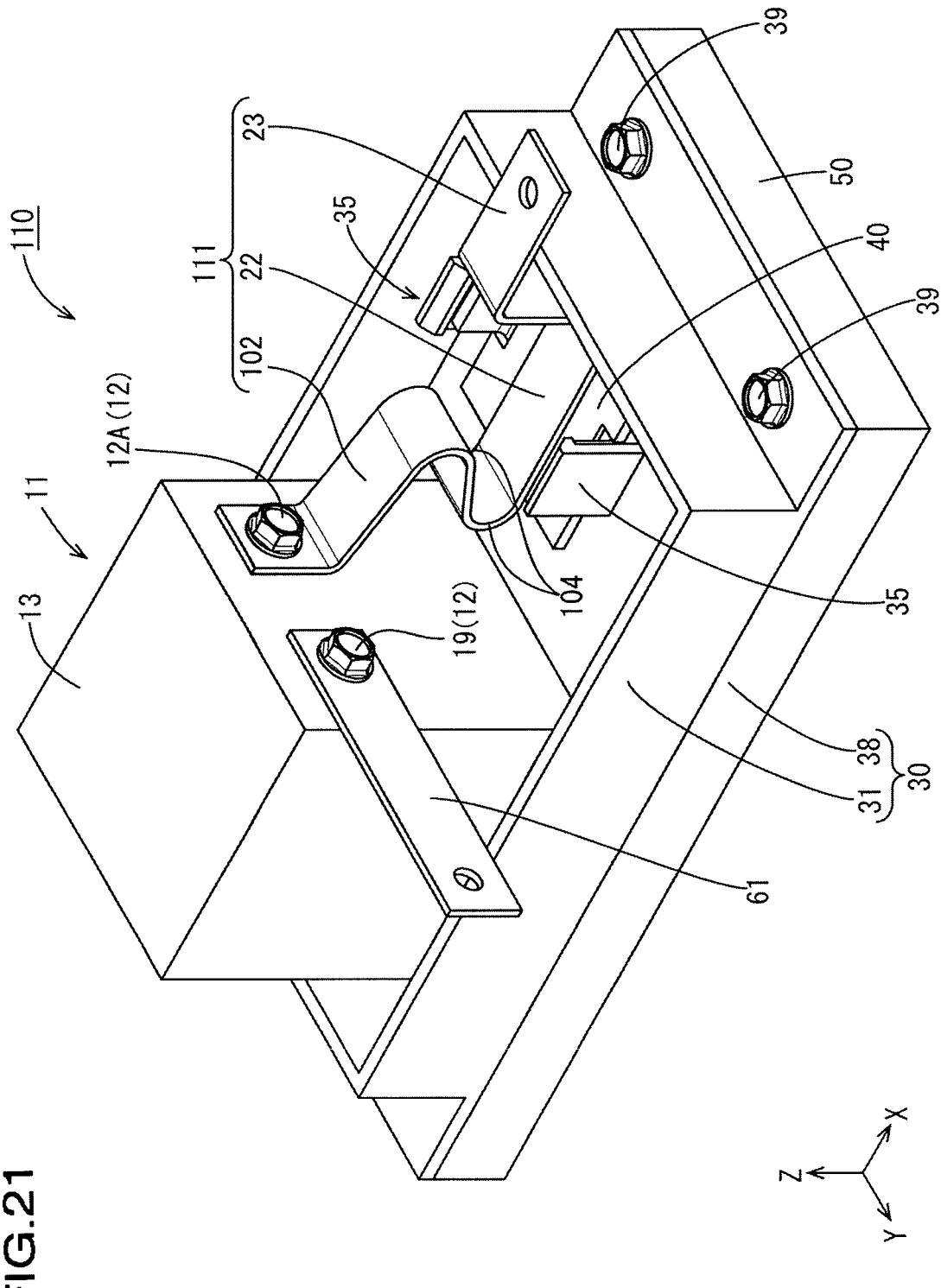
FIG. 21 is a perspective view showing a circuit assembly according to Embodiment 7.
Figure 22:
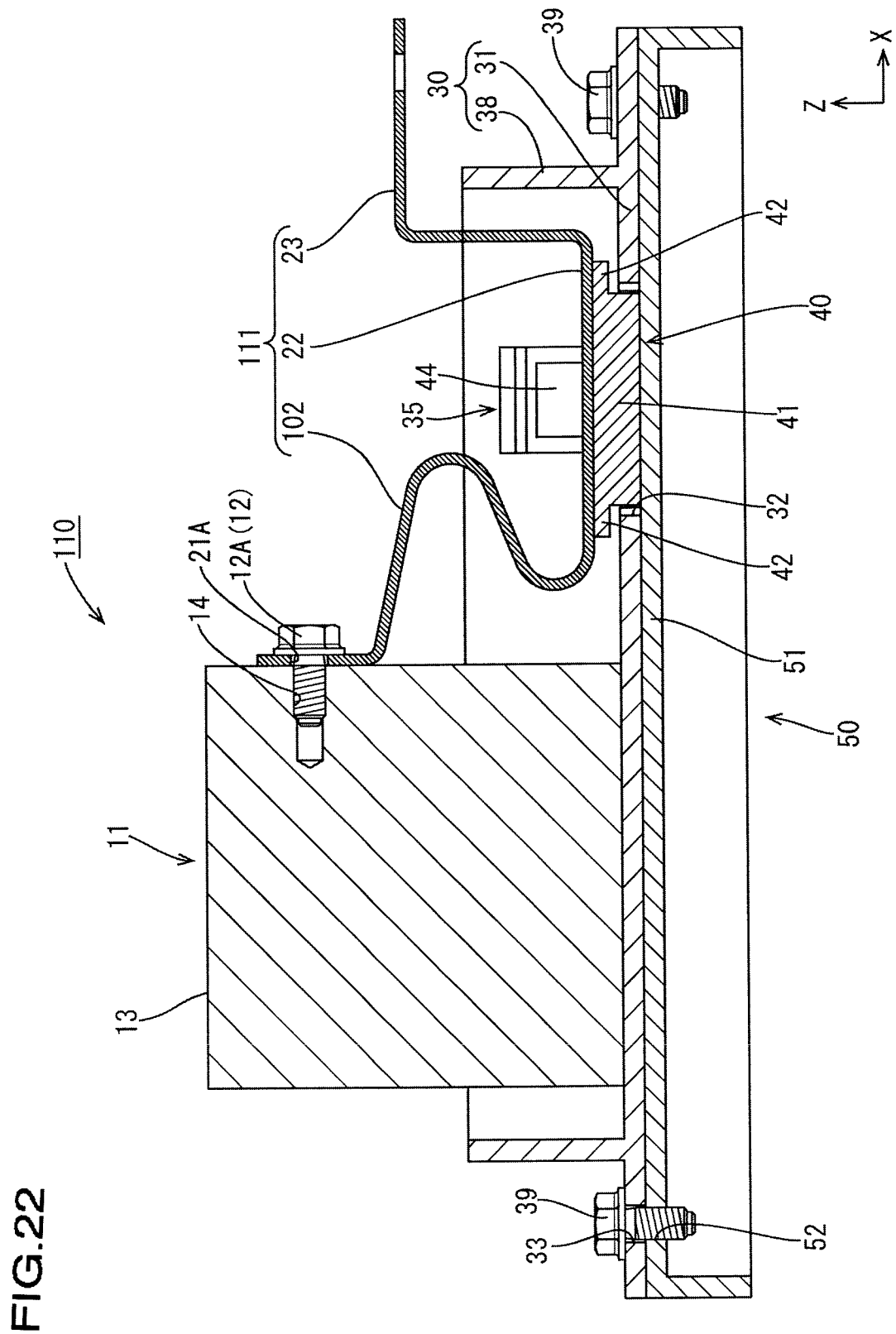
FIG. 22 is a vertical cross-sectional view showing the circuit assembly.
Figure 23:
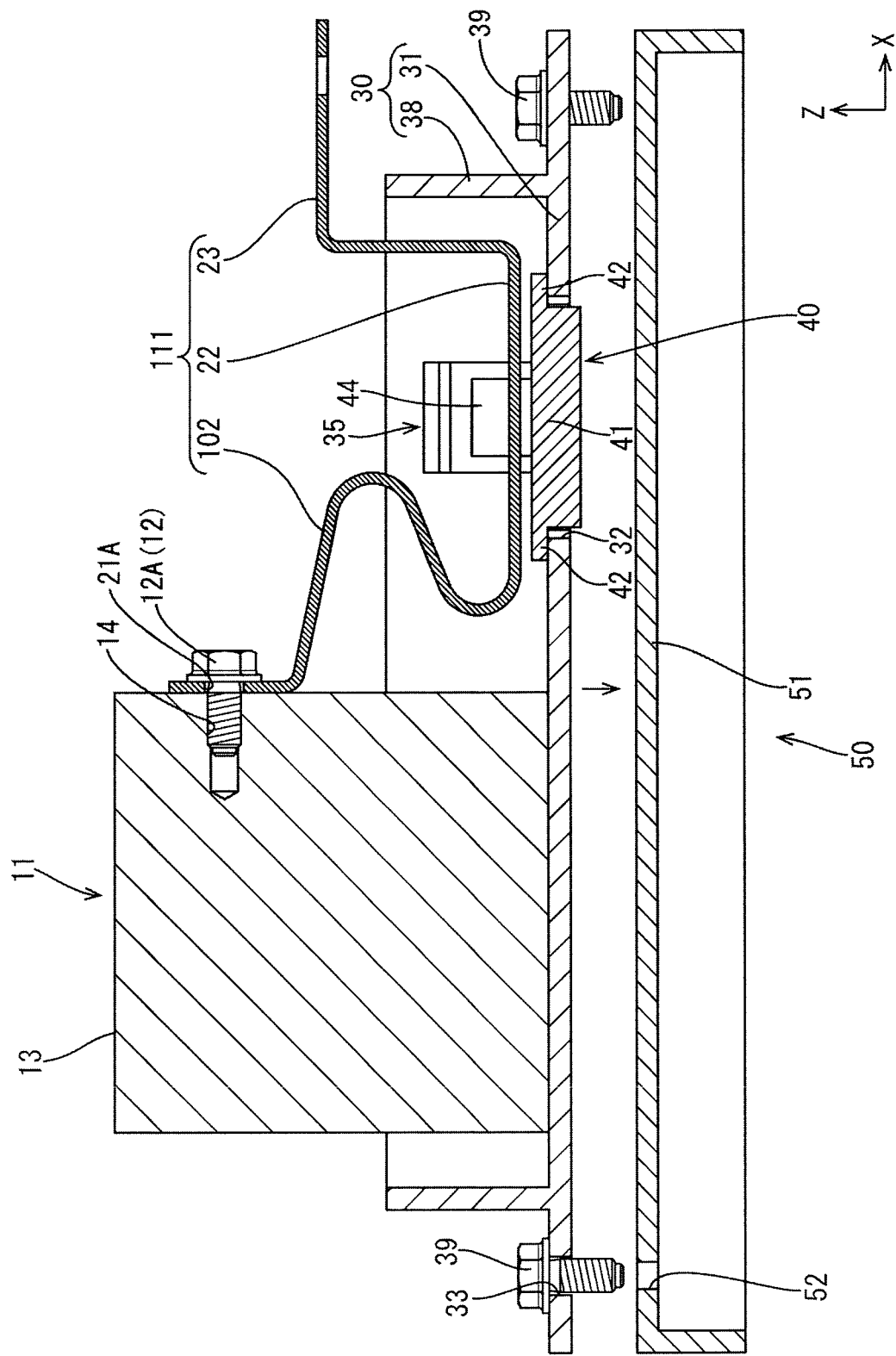
FIG. 23 is a diagram illustrating an assembling process of the circuit assembly.

Next, Embodiment 7 will be described with reference to FIGS. 21 to 23. In Embodiment 7, the third busbar 75 of Embodiment 6 is omitted, a first busbar 111 that is formed by providing the first busbar 101 with the external connection portion 23 is used, and the first busbar 111 is configured to be energized through operation of the relay 11. In the following, the same components as those of Embodiment 6 are denoted by the same reference numerals, and descriptions thereof are omitted.

The first busbar 111 of a circuit assembly 110 includes a terminal connection portion 102 that is connected to the terminal 12 of the relay 11, the opposing portion 22, and the external connection portion 23. To assemble the circuit assembly 110, as shown in FIG. 23, the base member 30 to which the relay 11, the heat transfer member 40, and the like have been attached is disposed on the heat dissipation member 50, and the base member 30 is fastened to the heat dissipation member 50 with the screws 39. As shown in FIG. 22, the heat transfer member 40 is moved upward relative to the base member 30, and the heat transfer member 40 abuts against the first busbar 111 to bias the first busbar 111 upward, as a result of which the first busbar 111 is elastically deformed by a small amount, thus forming the circuit assembly 110.

Embodiment 8

Next, Embodiment 8 will be described with reference to FIGS. 24 and 25. In Embodiment 8, the distal end portion of the first busbar 121 is embedded in a heat transfer member 125 and integrated therewith as one piece. In the following, the same components as those of the above-described embodiments are denoted by the same reference numerals, and descriptions thereof are omitted.

Figure 24:
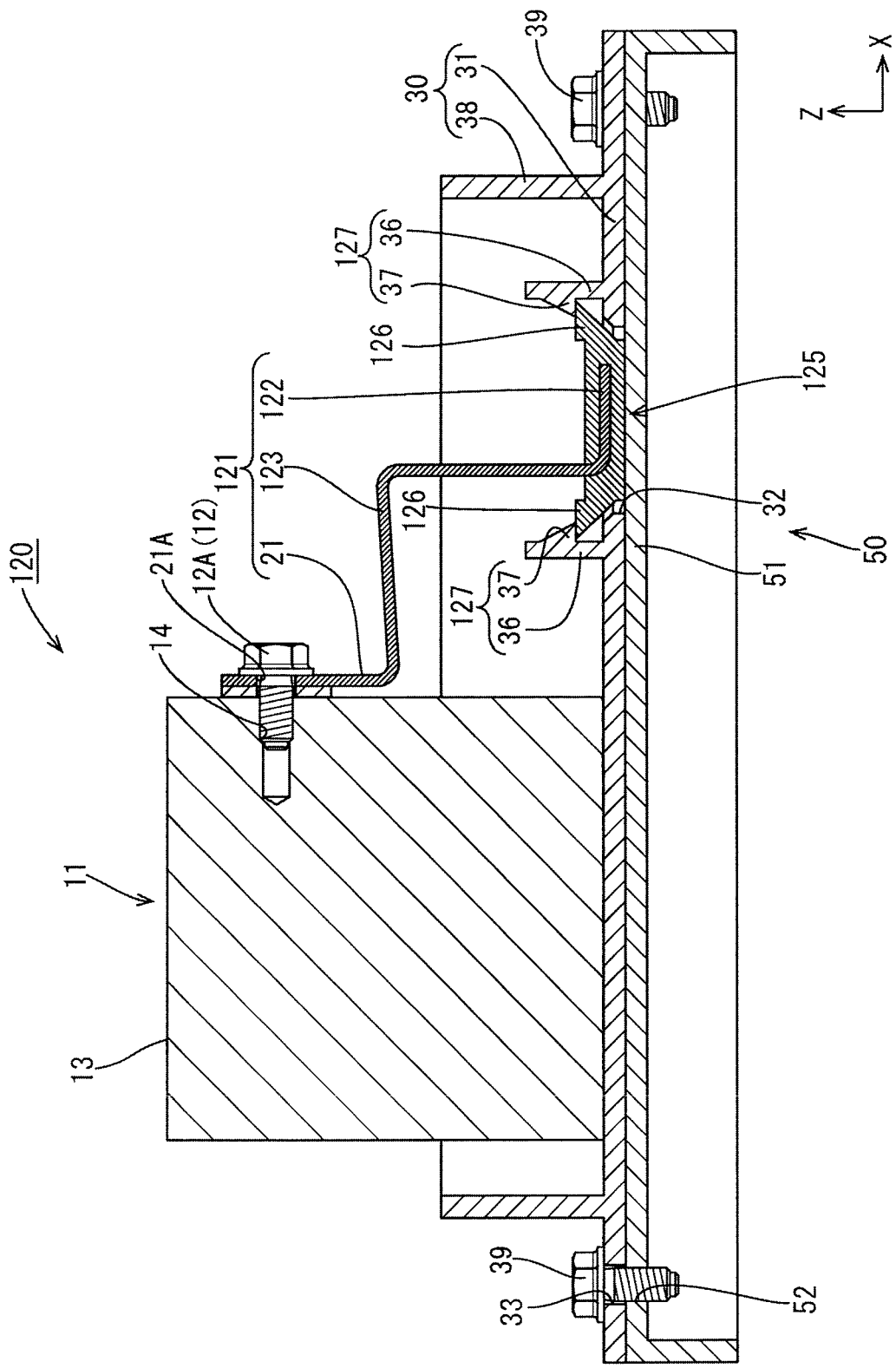
FIG. 24 is a vertical cross-sectional view showing a circuit assembly according to Embodiment 8.

As shown in FIG. 24, a circuit assembly 120 includes a first busbar 121, a heat transfer member 125 that is attached to the distal end portion of the first busbar 121 so as to be integrated into one piece therewith, the base member 30, and the heat dissipation member 50. The first busbar 121 includes the terminal connection portion 21 that is connected to the terminal 12 of the relay 11, an embedded portion 122 that is embedded in the heat transfer member 125, and an elastically deformable coupling portion 123 that couples the terminal connection portion 21 and the embedded portion 122 together. The coupling portion 123 is bent in an L-shape, and a portion thereof that is located downward of a portion that is fastened with the screw 12A is spaced apart from the front surface of the relay 11. At the edge portion of the through hole 32 (the vicinity of the through hole 32) in the plate-shaped portion 31, a pair of front and rear fastening portions 127 that lock to the heat transfer member 40 are provided standing upright relative to the plate-shaped portion 31.

The pair of fastening portions 127 include a pair of upright pieces 36 that are capable of undergoing bending deformation and extend in a band shape, and claw-shaped locking portions 37 that are provided at the distal end portions of the pair of upright pieces 36 and protrude to sides opposite to each other. The upright pieces 36 are each formed to have a fixed thickness dimension. Each locking portion 37 protrudes in a step shape at the upper end portion of the corresponding upright piece 36 toward the through hole 32 side, and its protruding dimension is decreased toward the upper end side (the distal end) in a sloped manner.

The heat transfer member 125 has a tapered outer circumference in which its diameter decreases downward, and locked portions 126 that protrude laterally (outward) at end portions in the lateral direction and are capable of being locked to the locking portions 37 are formed at its upper end portion. A predetermined length of the embedded portion 122 of the first busbar 121 is embedded in the heat transfer member 125. The heat transfer member 125 can be formed through molding involving placing the embedded portion 122 in a mold (not shown), injecting a resin into the mold, and solidifying the resin.

To assemble the circuit assembly 120, as shown in FIG. 25, the base member 30 to which the relay 11, the heat transfer member 40, and the like have been attached is disposed on the heat dissipation member 50, and the base member 30 is fastened to the heat dissipation member 50 with the screws 39. As shown in FIG. 24, the heat transfer member 40 is moved upward relative to the base member 30, and the heat transfer member 40 abuts against the first busbar 121 to bias the first busbar 121 upward, as a result of which the first busbar 121 is elastically deformed by a small amount, thus forming the circuit assembly 120.

According to Embodiment 8, the distal end portion of the first busbar 121 is embedded in the heat transfer member 125, and it is thus possible to improve thermal conductivity through close contact between the first busbar 121 and the heat transfer member 125, while inhibiting positional displacement between the first busbar 121 and the heat transfer member 125.

Other Embodiments

The technique described herein is not limited to the embodiments described and illustrated above. For example, the following embodiments also fall within the technical scope of the present invention.

1) In the above-described configurations, the relay 11 is fixed to the base member 30 by screwing the second busbar 25 to the base member 30; however, the technique described herein is not limited thereto. For example, it is possible to adopt a configuration in which the relay 11 is directly fixed to the base member 30 using a relay fixation member such as a bracket to which the relay 11 can be fastened with a screw. The means for fixing the relay 11 is not limited to a screw or the like. For example, an adhesive or the like may be used to fix the base member 30 to the relay 11.

(2) A guide member may be inserted between the wall of the through hole 32 of the base member 30 and each of the heat transfer member 40 and 125, thus facilitating assembly, movement, positioning and the like of the heat transfer members 40 and 125.

(3) In the above-described configurations, the base member 30 is provided with the fastening portion 35 or 127; however, the technique described herein is not limited thereto. For example, movement of the heat transfer members 40 and 25 that exceeds a predetermined amount may be limited by the elastic force of the first busbars 20, 71, 81, 91, 101, 111, and 121, without providing the fastening portion 35 or 127 on the base member 30.

LIST OF REFERENCE NUMERALS 10, 60, 70, 80, 90, 100, 110, 120: Circuit assembly
11: Relay (heat generation component)
12: Terminal
12A: Screw
20, 71, 81, 91, 101, 111, 121: First busbar (busbar)
21, 82, 102: Terminal connection portion
21A: Screw hole
22: Opposing portion
22A, 73: Heat transfer contact portion
25, 61: Second busbar
30: Base member
31: Plate-shaped portion
32: Through hole
35, 127: Fastening portion
40, 125: Heat transfer member
41: Body
42: Bulging portion
50: Heat dissipation member
51A: Contact portion
83, 103: Elastic portion
122: Embedded portion
126: Locked portion
127: Fastening portion

What is claimed is:

1. A circuit assembly comprising:
a heat generator component that includes a terminal and generates heat when energized or as a result of energization or due to being energized;
a base member to which the heat generator component is attached and in which a through hole is formed;
a heat dissipator that is provided on a side of the base member opposite to a side on which the heat generator component is attached;
a busbar that is connected to the terminal of the heat generator component at a position spaced apart from the base member; and
a heat transfer structure that is inserted into the through hole so as to be movable in a direction along an axial direction of the through hole, and that comes into contact with the busbar and the heat dissipator.

2. The circuit assembly according to claim 1, wherein the busbar is elastically deformed by being pressed by the heat transfer structure.

3. The circuit assembly according to claim 1, wherein a fastener portion configured to limit movement of the heat transfer structure that exceeds a predetermined amount is fixed to the base member.

4. The circuit assembly according to claim 1, wherein a surface of the busbar is in surface contact with a surface of the heat transfer structure.

5. The circuit assembly according to claim 1, wherein the busbar is embedded in the heat transfer structure.

6. The circuit assembly according to claim 1, wherein the busbar is a heat dissipating busbar configured not to be energized when the heat generator component is in operation.

7. The circuit assembly according to claim 1, wherein the heat transfer structure includes a body that is passed through the through hole, and a bulge portion that extends in a radial direction of the body and that is not inserted into the through hole, and the bulge portion is disposed between the busbar and the base member.

8. The circuit assembly according to claim 1, wherein a gap is formed between an outer peripheral surface of the heat transfer structure and a wall of the through hole, so that the heat transfer structure is movably disposed in the through hole along the axial direction of the through hole.

9. The circuit assembly according to claim 1, wherein the heat transfer structure is disposed to be insertable into and removable from the through hole.

* * * * *